(12) United States Patent
Mostafalu et al.

(10) Patent No.: US 12,003,870 B2
(45) Date of Patent: Jun. 4, 2024

(54) BINNING IN HYBRID PIXEL STRUCTURE OF IMAGE PIXELS AND EVENT VISION SENSOR (EVS) PIXELS

(71) Applicant: Sony Semiconductor Solutions Corporation, Kanagawa (JP)

(72) Inventors: Pooria Mostafalu, Penfield, NY (US); Frederick T. Brady, Webster, NY (US); Sungin Han, Pittsford, NY (US); Hongyi Mi, Victor, NY (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/721,801

(22) Filed: Apr. 15, 2022

(65) Prior Publication Data

US 2023/0336881 A1    Oct. 19, 2023

(51) Int. Cl.
| | |
|---|---|
| *H04N 25/46* | (2023.01) |
| *H01L 29/06* | (2006.01) |
| *H01L 29/66* | (2006.01) |
| *H01L 31/10* | (2006.01) |
| *H04N 25/42* | (2023.01) |
| *H04N 25/70* | (2023.01) |
| *H04N 25/77* | (2023.01) |

(52) U.S. Cl.
CPC ............. *H04N 25/46* (2023.01); *H04N 25/42* (2023.01); *H04N 25/77* (2023.01)

(58) Field of Classification Search
CPC .. H04N 25/707; H04N 25/702; H04N 25/703; H04N 25/445; H04N 25/773; H04N 25/46; H04N 25/42; H04N 25/77; H01L 29/0626; H01L 29/6613; H01L 29/7313; H01L 31/107
See application file for complete search history.

(56) References Cited

U.S. PATENT DOCUMENTS

| | | | | |
|---|---|---|---|---|
| 10,313,610 | B2* | 6/2019 | Fu | H04N 25/46 |
| 10,321,081 | B2* | 6/2019 | Watanabbe | H04N 25/771 |
| 11,297,269 | B2* | 4/2022 | Yasuda | H04N 25/778 |
| 11,330,211 | B2* | 5/2022 | Mehta | H04N 25/75 |
| 11,430,828 | B2* | 8/2022 | Gao | H04N 25/50 |
| 11,563,909 | B1* | 1/2023 | Chen | H04N 25/702 |
| 11,729,534 | B1* | 8/2023 | Suess | H04N 25/707 |

(Continued)

FOREIGN PATENT DOCUMENTS

| | | |
|---|---|---|
| WO | 2021261069 A1 | 12/2021 |
| WO | 2021261070 A1 | 12/2021 |

OTHER PUBLICATIONS

International Search Report dated Jun. 13, 2023 for corresponding International Application No. PCT/IB2023/052837.

*Primary Examiner* — Marly S Camargo
(74) *Attorney, Agent, or Firm* — Michael Best & Friedrich LLP

(57) ABSTRACT

Binning in a hybrid pixel structure of image pixels and event vision sensor (EVS) pixels. In one embodiment, the imaging sensor includes a pixel array including a plurality of pixel circuits and a plurality of binning transistors. A first portion of the plurality of pixel circuits individually includes an intensity photodiode. A second portion of the plurality of pixel circuits individually includes an event vision sensor (EVS) photodiode. The plurality of binning transistors is configured to bin together at least one of the first portion or the second portion.

20 Claims, 17 Drawing Sheets

(56) References Cited

U.S. PATENT DOCUMENTS

| | | | | |
|---|---|---|---|---|
| 2017/0302866 A1* | 10/2017 | Fu | .......................... | H04N 25/46 |
| 2018/0167575 A1* | 6/2018 | Watanabe | .............. | H04N 25/75 |
| 2021/0168314 A1* | 6/2021 | Mehta | .................. | H04N 25/702 |
| 2022/0199671 A1* | 6/2022 | Gao | ....................... | H04N 25/50 |

* cited by examiner

BINNING IN HYBRID PIXEL STRUCTURE OF IMAGE PIXELS AND EVENT VISION SENSOR (EVS) PIXELS

BACKGROUND OF THE INVENTION

1. Field of the Invention

This application relates generally imaging sensors. More specifically, this application relates to programmable floating diffusion binning in hybrid structure of image pixel and event vision sensor (EVS) pixel.

2. Description of Related Art

Image sensing devices typically include an imaging sensor, generally implemented as an array of pixel circuits, as well as signal processing circuitry and any associated control or timing circuitry. Within the imaging sensor itself, charge is collected in a photoelectric conversion device of the pixel circuit as a result of impinging light. There are typically a very large number of individual photoelectric conversion devices (e.g. tens of millions), and many signal processing circuitry components working in parallel. Various components within the signal processing circuitry are shared by a large number of photoelectric conversion devices; for example, a column or multiple columns of photoelectric conversion devices may share a single analog-to-digital converter (ADC) or sample-and-hold (S/H) circuit.

In photography applications, the outputs of the pixel circuits are used to generate an image. In addition to photography, imaging sensors are used in a variety of applications which may utilize the collected charge for additional or alternative purposes. For example, in applications such as game machines, autonomous vehicles, telemetry systems, factory inspection, gesture controlled computer input devices, and the like, it may be desirable to detect the depth of various objects in a three-dimensional space and/or detect an amount of light reflected off the various objects in the same three-dimensional space.

Moreover, some imaging sensors support pixel binning operations. In binning, input pixel values from neighboring pixel circuits are averaged together with or without weights to produce an output pixel value. Binning results in a reduced resolution or pixel count in the output image, and may be utilized so as to permit the imaging sensor to operate effectively in low light conditions or with reduced power consumption.

BRIEF SUMMARY OF THE INVENTION

Various aspects of the present disclosure relate to devices, methods, and systems having imaging with ambient light subtraction therein. Specifically, the present disclosure is directed to binning that enhances event detection by EVS photodiodes in typical contrast and in low light. Additionally, the binning in EVS photodiodes may also increase pixel response speed.

In one aspect of the present disclosure, an imaging sensor is provided. The imaging sensor includes a pixel array including a plurality of pixel circuits and a plurality of binning transistors. A first portion of the plurality of pixel circuits individually includes an intensity photodiode. A second portion of the plurality of pixel circuits individually includes an event vision sensor (EVS) photodiode. The plurality of binning transistors is configured to bin together at least one of the first portion or the second portion.

In another aspect of the present disclosure, a method is provided. The method includes controlling, with control circuitry, a plurality of binning transistors according to a first mode. The method also includes controlling, with the control circuitry, the plurality of binning transistors to change from the first mode to a second mode. In the second mode, the plurality of binning transistors bins together at least one of a first portion of a plurality of pixel circuits in a pixel array or a second portion of the plurality of pixel circuits. The first portion of the plurality of pixel circuits individually includes an intensity photodiode and the second portion of the plurality of pixel circuits individually includes an event vision sensor (EVS) photodiode.

In yet another aspect of the present disclosure, an electronic device is provided. The electronic includes a pixel array including a plurality of pixel circuits and a plurality of binning transistors. A first portion of the plurality of pixel circuits individually includes an intensity photodiode. A second portion of the plurality of pixel circuits individually includes an event vision sensor (EVS) photodiode. The plurality of binning transistors is configured to bin together at least one of the first portion or the second portion.

In this manner, the above aspects of the present disclosure provide for improvements in at least the technical field of object feature detection as well as in related technical fields of imaging, image processing, and the like.

This disclosure can be embodied in various forms, including hardware or circuits controlled by computer-implemented methods, computer program products, computer systems and networks, user interfaces, and application programming interfaces; as well as hardware-implemented methods, signal processing circuits, imaging sensor circuits, application specific integrated circuits, field programmable gate arrays, and the like. The foregoing summary is intended solely to give a general idea of various aspects of the present disclosure, and does not limit the scope of the disclosure in any way.

DESCRIPTION OF THE DRAWINGS

These and other more detailed and specific features of various embodiments are more fully disclosed in the following description, reference being had to the accompanying drawings, in which.

DETAILED DESCRIPTION

In the following description, numerous details are set forth, such as flowcharts, data tables, and system configurations. It will be readily apparent to one skilled in the art that these specific details are merely exemplary and not intended to limit the scope of this application.

Moreover, while the present disclosure focuses mainly on examples in which the processing circuits are used in imaging sensors, it will be understood that this is merely one example of an implementation. It will further be understood that the disclosed, devices, methods, and systems may be used in any device in which there is a need to detect object features (for example, facial detection).

Imaging System

Figure 1:
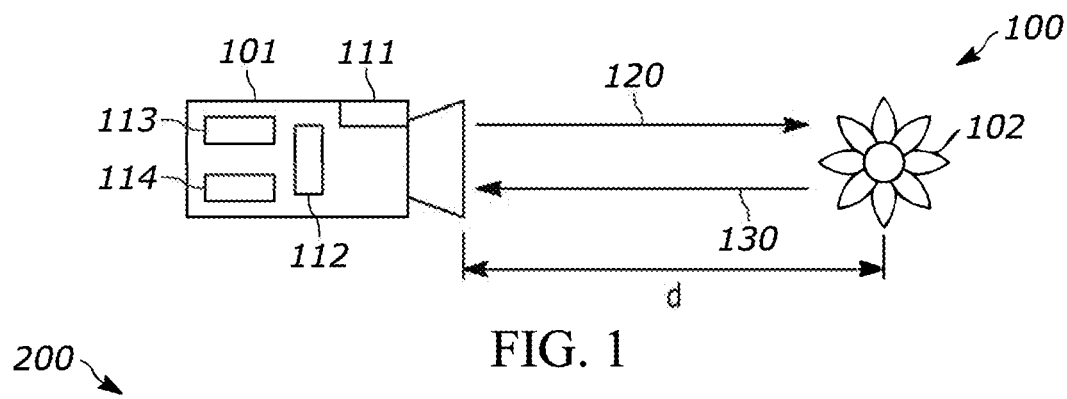
FIG. 1 is a diagram illustrating an example imaging environment according to various aspects of the present disclosure.

FIG. 1 is a diagram illustrating an example imaging environment 100 according to various aspects of the present disclosure. In the example of FIG. 1, the imaging environment 100 includes an imaging system 101 that is configured to image an object 102 located a distance d away. The imaging system 101 includes a light generator 111 configured to generate an emitted light wave 120 toward the object 102 and an imaging sensor 112 configured to receive a reflected light wave 130 from the object 102. The emitted light wave 120 may have a periodic waveform. The imaging sensor 112 may be any device capable of converting incident radiation into signals. For example the imaging sensor may be a Complementary Metal-Oxide Semiconductor (CMOS) Imaging sensor (CIS), a Charge-Coupled Device (CCD), and the like. The imaging system 101 may further include distance determination circuitry such as a controller 113 (for example, a microprocessor or other suitable processing device) and a memory 114, which may operate to perform one or more examples of object feature detection processing (e.g., facial detection) and/or time-of-flight processing. The light generator 111, the imaging sensor 112, the controller 113, and the memory 114 may be communicatively connected to each other via one or more communication buses.

The light generator 111 may be, for example, a light emitting diode (LED), a laser diode, or any other light generating device or combination of devices, and the light waveform may be controlled by the controller 113. The light generator may operate in the infrared range so as to reduce interference from the visible spectrum of light, although any wavelength range perceivable by the imaging sensor 112 may be utilized. In some examples, the controller 113 may be configured to receive a light intensity image from the imaging sensor 112 in which ambient light has been subtracted from the light intensity image, and detect features of the object 102 with the light intensity image. For example, the light intensity image may be an IR or near-IR light intensity image for detection of facial features. Additionally, in some examples, the controller 113 may also be configured to receive a depth image from the imaging sensor and calculate a depth map indicative of the distance d to various points of the object 102.

Figure 2:
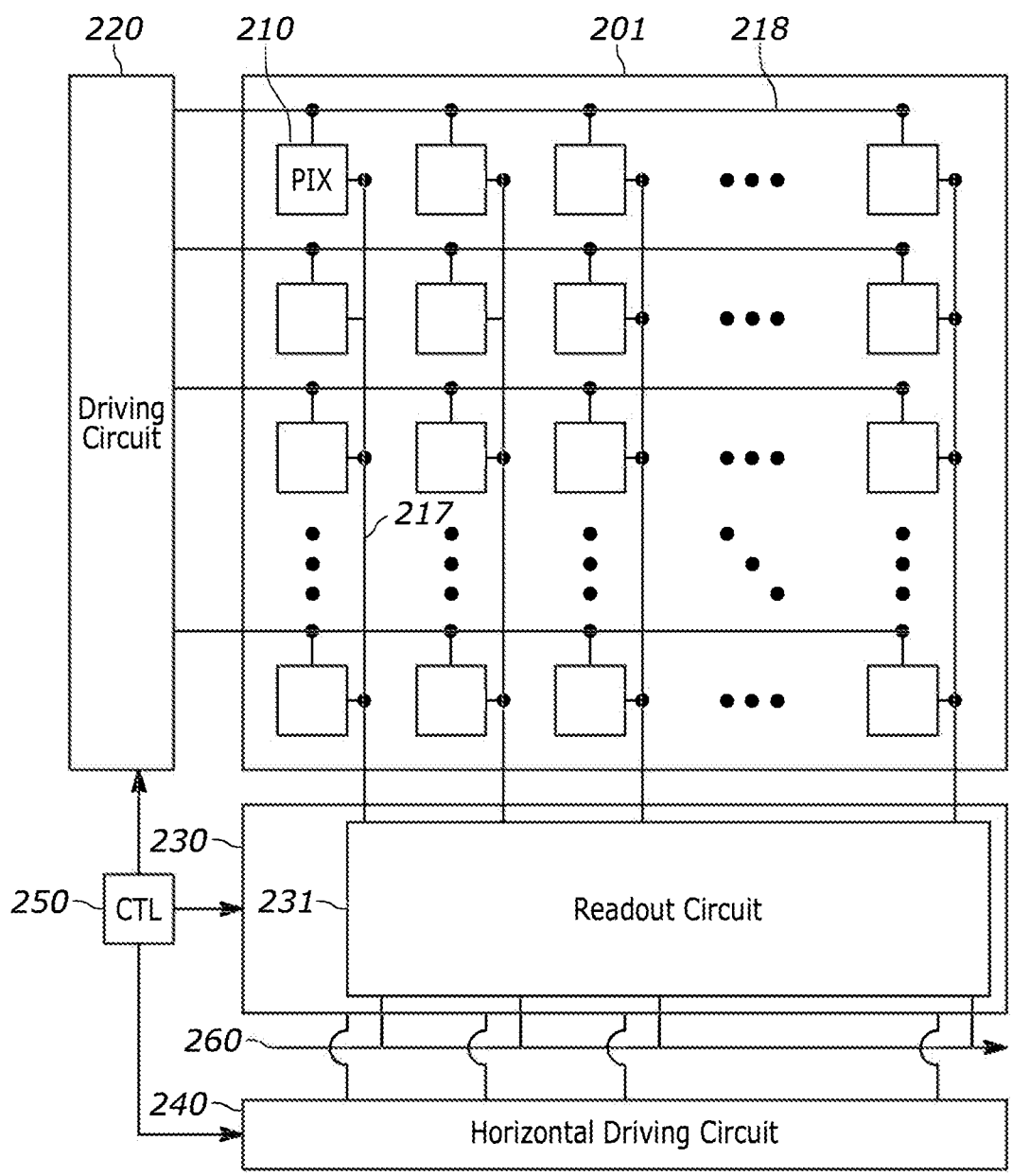
FIG. 2 is a circuit diagram illustrating an example imaging sensor according to various aspects of the present disclosure.

FIG. 2 is a circuit diagram illustrating an example imaging sensor 200 according to various aspects of the present disclosure. The imaging sensor 200 includes an array 201 of pixel circuits 210. The pixel circuits 210 are located at intersections where horizontal signal lines 218 and vertical signal lines 217 cross one another. The horizontal signal lines 218 are operatively connected to a vertical driving circuit 220, also known as a "row scanning circuit," at a point outside of the pixel array 201, and carry signals from the vertical driving circuit 220 to a particular row of the pixel circuits 210. Pixels in a particular column output analog signals corresponding to respective amounts of incident light to the vertical signal line 217. For illustration purposes, only a subset of the pixel circuits 210 are actually shown in FIG. 2; however, in practice the imaging sensor 200 may have up to tens of millions of pixel circuits ("megapixels" or MP) or more.

The vertical signal lines 217 conduct the analog signals for a particular column to a column circuit 230, also known as a "signal processing circuit." Moreover, while FIG. 2 illustrates a single readout circuit 231 for all columns, the imaging sensor 200 may utilize a plurality of readout circuits 231. The analog electrical signals generated in photoelectric conversion device 201 in the pixel circuit 210 is retrieved by the readout circuit 231 and is then converted to digital values. Such a conversion typically requires several circuit components such as sample-and-hold (S/H) circuits, analog-to-digital converters (ADCs), and timing and control circuits, with each circuit component serving a purpose in the conversion. For example, the purpose of the S/H circuit may be to sample the analog signals from different time phases of the photodiode operation, after which the analog signals may be converted to digital form by the ADC.

Figure 3:
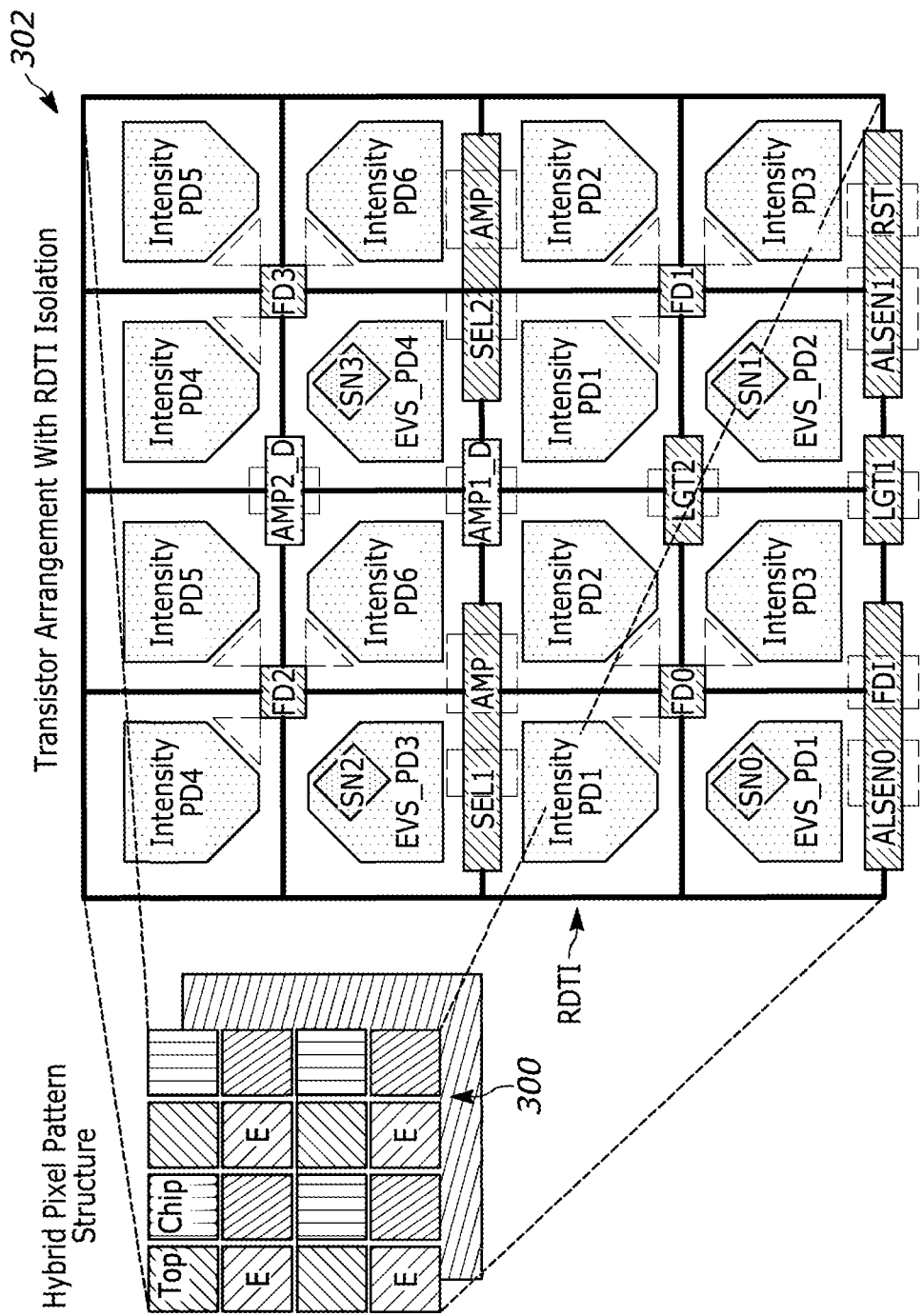
FIG. 3 is a diagram illustrating a first example transistor arrangement of a hybrid unit pixel in the example imaging sensor of FIG. 2 according to various aspects of the present disclosure.

FIG. 3 is a diagram illustrating a first example transistor arrangement 302 of a hybrid unit pixel 300 in the example imaging sensor 200 of FIG. 2 according to various aspects of the present disclosure. In the example of FIG. 3, the hybrid unit pixel 300 includes sixteen pixels that correspond to the pixel circuits 210 of FIG. 2, and the sixteen pixels are isolated from each other with rear deep trench isolation (RDTI).

In particular, the hybrid unit pixel 300 includes twelve image pixels and four EVS pixels. Of the twelve image pixels, the hybrid unit pixel 300 includes four red image pixels, four green image pixels, and four blue image pixels.

As illustrated FIG. 3, from left to right, a first row of the hybrid unit pixel 300 includes a first red image pixel, a first green image pixel, a second red image pixel, and a second green image pixel. A second row of the hybrid unit pixel 300 includes a first EVS pixel, a first blue image pixel, a second EVS pixel, and a second blue image pixel. A third row of the hybrid unit pixel 300 includes a third red image pixel, a third green image pixel, a fourth red image pixel, and a fourth green image pixel. A fourth row of the hybrid unit pixel 300 includes a third EVS pixel, a third blue image pixel, a fourth EVS pixel, and a fourth blue image pixel.

As illustrated in FIG. 3, from left to right, a first row of the first example transistor arrangement 302 includes a first intensity photodiode PD4, a first intensity photodiode PD5, a second intensity photodiode PD4, and a second intensity photodiode PD4. The intensity photodiodes PD4 correspond to red image pixels and the intensity photodiodes PD5 correspond to green image pixels. The first intensity photodiode PD4 and the first intensity PD5 have gates that share a floating diffusion FD2. The second intensity photodiode PD4 and the second intensity PD5 have gates that share a floating diffusion FD3.

As illustrated in FIG. 3, from left to right, a second row of the first example transistor arrangement 302 includes a first EVS photodiode EVS_PD3, a first intensity photodiode PD6, a second EVS photodiode EVS_PD4, and a second intensity photodiode PD6. The intensity photodiodes PD6 correspond to blue image pixels. The EVS photodiode EVS_PD3 and the EVS photodiode EVS_PD4 correspond to EVS pixels. The EVS photodiode EVS_PD3 includes a sense node SN2 and the EVS photodiode EVS_PD4 includes a sense node SN3.

The first intensity photodiode PD6 has a gate that shares the floating diffusion FD2 with the gates of the first intensity photodiode PD4 and the first intensity photodiode PD5. The second intensity photodiode PD6 has a gate that shares the floating diffusion FD3 with the gates of the second intensity photodiode PD4 and the second intensity photodiode PD5.

As illustrated in FIG. 3, from left to right, a third row of the first example transistor arrangement 302 includes a third intensity photodiode PD1, a third intensity photodiode PD2, a fourth intensity photodiode PD1, and a fourth intensity photodiode PD2. The intensity photodiodes PD1 correspond to red image pixels and the intensity photodiodes PD2 correspond to green image pixels. The third intensity photodiode PD1 and the third intensity PD2 have gates that share a floating diffusion FD0. The fourth intensity photodiode PD1 and the fourth intensity PD2 have gates that share a floating diffusion FD1.

As illustrated in FIG. 3, from left to right, a fourth row of the first example transistor arrangement 302 includes a third EVS photodiode EVS_PD1, a third intensity photodiode PD3, a fourth EVS photodiode EVS_PD2, and a fourth intensity photodiode PD3. The intensity photodiodes PD3 correspond to blue image pixels. The EVS photodiode EVS_PD1 and the EVS photodiode EVS_PD2 correspond to EVS pixels. The EVS photodiode EVS_PD1 includes a sense node SN0 and the EVS photodiode EVS_PD2 includes a sense node SN1.

The third intensity photodiode PD3 has a gate that shares the floating diffusion FD0 with the gates of the third intensity photodiode PD1 and the third intensity photodiode PD2. The fourth intensity photodiode PD3 has a gate that shares the floating diffusion FD1 with the gates of the fourth intensity photodiode PD1 and the fourth intensity photodiode PD2.

As illustrated in FIG. 3, the first example transistor arrangement 302 includes a plurality of AMP transistors, a plurality of LGT transistors, a plurality of selection transistors, a plurality of ALSEN transistors, a FDI transistor, and a reset transistor. The plurality of AMP transistors includes a first AMP transistor, a second AMP transistor, a AMP1_D transistor, and a AMP2_D transistor that are located over the RDTI.

The first AMP transistor is located adjacent to and between the first EVS photodiode EVS_PD3, the first intensity photodiode PD6, the third intensity photodiode PD1, and the third intensity photodiode PD2. The second AMP transistor is located adjacent to and between the second EVS photodiode EVS_PD4, the second intensity photodiode PD6, the fourth intensity photodiode PD1, and the fourth intensity photodiode PD2. The AMP1_D transistor is located adjacent to and between the second EVS photodiode EVS_PD4, the first intensity photodiode PD6, the third intensity photodiode PD2, and the fourth intensity photodiode PD1. The AMP2_D transistor is located adjacent to and between the second EVS photodiode EVS_PD4, the first intensity photodiode PD6, the first intensity photodiode PD5, and the second intensity photodiode PD4.

The plurality of selection transistors includes a first selection transistor SEL1 and a second selection transistors SEL2. The first selection transistor SEL1 is located adjacent to and between the first EVS photodiode EVS_PD3 and the third intensity photodiode PD1. The second selection transistor SEL2 is located adjacent to and between the second EVS photodiode EVS_PD4 and the fourth intensity photodiode PD1.

The plurality of LGT transistors includes a first LGT transistor LGT1 and a second LGT transistor LGT2. The first LGT transistor LGT1 is located adjacent to the fourth EVS photodiode EVS_PD2 and the third intensity photodiode PD3. The second LGT transistor LGT2 is located adjacent to and between the fourth EVS photodiode EVS_PD2, the third intensity photodiode PD3, the third intensity photodiode PD2, and the fourth intensity photodiode PD1.

The plurality of ALSEN transistors includes a first ALSEN transistor ALSEN0 and a second ALSEN transistor ALSEN1. The first ALSEN transistor ALSEN0 is located adjacent to the third EVS photodiode EVS_PD1. The second ALSEN transistor ALSEN1 is located adjacent to the fourth EVS photodiode EVS_PD2.

The reset transistor RST is located adjacent to the fourth intensity photodiode PD3. The FDI transistor is located adjacent to the third EVS photodiode EVS_PD1 and the third intensity photodiode PD3.

In the hybrid unit pixel 300, event pixels are distributed with symmetry and the imaging pixels may be binned with a 2×N pattern. Additionally, the hybrid unit pixel 300 provides simple horizontal binning due to the symmetric color filter array within the hybrid unit pixel 400. The hybrid unit pixel 300 also sufficient EVS sensitivity and smaller unit cell comparing other CFA patterns.

Figure 4:
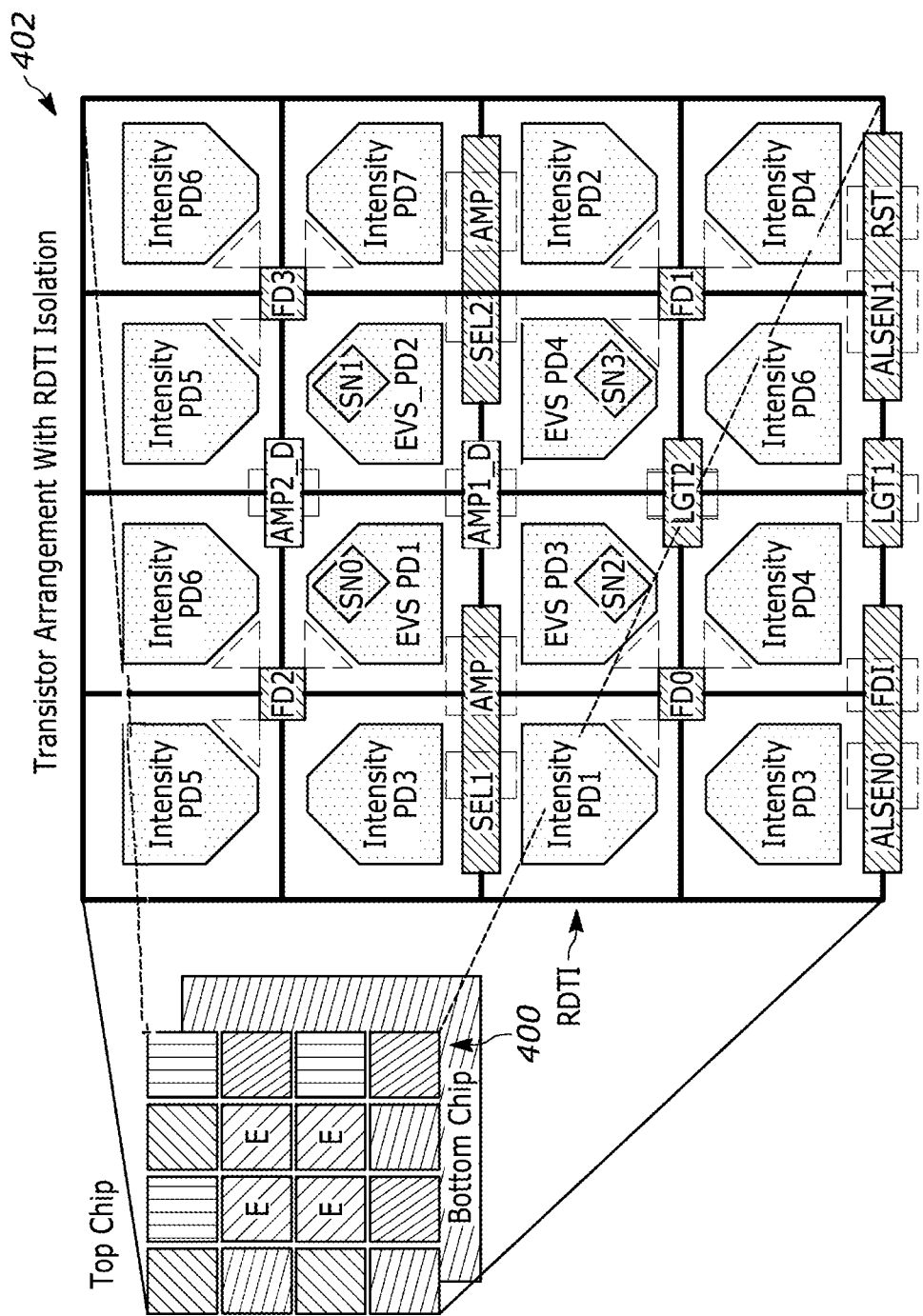
FIG. 4 is a diagram illustrating a second example transistor arrangement of a hybrid unit pixel in the example imaging sensor of FIG. 2 according to various aspects of the present disclosure.

FIG. 4 is a diagram illustrating a second example transistor arrangement 402 of a hybrid unit pixel 400 in the example imaging sensor of FIG. 2 according to various aspects of the present disclosure. In the example of FIG. 4, the hybrid unit pixel 400 includes sixteen pixels that correspond to the pixel circuits 210 of FIG. 2, and the sixteen pixels are isolated from each other with rear deep trench isolation (RDTI).

The second example transistor arrangement 402 is similar to the first example transistor arrangement 302 of FIG. 3. For example, the hybrid unit pixel 400 includes twelve image pixels and four EVS pixels. However, unlike the first example transistor arrangement 302, the second example transistor arrangement 402 include the four EVS pixels being located in the center of the hybrid unit pixel 400 and with six green image pixels and three blue image pixels.

As illustrated FIG. 4, from left to right, a first row of the hybrid unit pixel 400 includes a first red image pixel, a first green image pixel, a second red image pixel, and a second green image pixel. A second row of the hybrid unit pixel 400 includes a third green pixel, a first EVS pixel, a second EVS pixel, and a first blue image pixel. A third row of the hybrid unit pixel 400 includes a third red image pixel, a third EVS pixel, a fourth EVS pixel, and a fourth green image pixel. A fourth row of the hybrid unit pixel 300 includes a fifth green image pixel, a second blue image pixel, a sixth green image pixel, and a third blue image pixel.

As illustrated in FIG. 4, from left to right, a first row of the second example transistor arrangement 402 includes a first intensity photodiode PD5, a first intensity photodiode PD6, a second intensity photodiode PD5, and a second intensity photodiode PD6. The intensity photodiodes PD5 correspond to red image pixels and the intensity photodiodes PD6 correspond to green image pixels. The first intensity photodiode PD5 and the first intensity PD6 have gates that share a floating diffusion FD2. The second intensity photodiode PD5 and the second intensity photodiode PD6 have gates that share a floating diffusion FD3.

As illustrated in FIG. 4, from left to right, a second row of the second example transistor arrangement 402 includes a first intensity photodiode PD3, a first EVS photodiode EVS_PD1, a second EVS photodiode EVS_PD2, and a first intensity photodiode PD7. The intensity photodiode PD3 corresponds to a green image pixel and the intensity photodiode PD7 corresponds to a blue image pixel. The EVS photodiode EVS_PD1 and the EVS photodiode EVS_PD2 correspond to EVS pixels.

The EVS photodiode EVS_PD1 includes a sense node SN0. The EVS photodiode EVS_PD2 includes a sense node SN1. The EVS photodiode EVS_PD3 includes a sense node SN2. The EVS photodiode EVS_PD4 includes a sense node SN3.

The first intensity photodiode PD3 has a gate that shares the floating diffusion FD2 with the gates of the first intensity photodiode PD5 and the first intensity photodiode PD6. The first intensity photodiode PD7 has a gate that shares the floating diffusion FD3 with the gates of the second intensity photodiode PD5 and the second intensity photodiode PD6.

As illustrated in FIG. 4, from left to right, a third row of the second example transistor arrangement 402 includes a third intensity photodiode PD1, a third EVS photodiode EVS_PD3, a fourth EVS photodiode PD4, and a fourth intensity photodiode PD2. The third intensity photodiode PD1 corresponds to a red image pixel and the fourth intensity photodiode PD2 corresponds to a green image pixel. The third intensity photodiode PD1 has a gate that shares a floating diffusion FD0. The fourth intensity PD2 has a gate that shares a floating diffusion FD1.

As illustrated in FIG. 4, from left to right, a fourth row of the second example transistor arrangement 402 includes a fifth intensity photodiode PD3, a second intensity photodiode PD4, a sixth intensity PD6, and a third intensity photodiode PD4. The fifth intensity photodiode PD3 and the sixth intensity photodiode PD6 correspond to green image pixels. The intensity photodiodes PD4 correspond to blue image pixels.

The fifth intensity photodiode PD3 and the second intensity photodiode PD4 have gates that share the floating diffusion FD0 with the gate of the third intensity photodiode PD1. The sixth intensity photodiode PD6 and the third intensity photodiode PD4 have gates that share the floating diffusion FD1 with the gate of the fourth intensity photodiode PD2.

As illustrated in FIG. 4, the second example transistor arrangement 402 includes a plurality of AMP transistors, a plurality of LGT transistors, a plurality of selection transistors, a plurality of ALSEN transistors, a FDI transistor, and a reset transistor. The plurality of AMP transistors includes a first AMP transistor, a second AMP transistor, a AMP1_D transistor, and a AMP2_D transistor that are located over the RDTI.

The first AMP transistor is located adjacent to and between the first EVS photodiode EVS_PD1, the third intensity photodiode PD7, the third intensity photodiode PD1, and the second EVS photodiode EVS_PD3. The second AMP transistor is located adjacent to and between the second EVS photodiode EVS_PD2, the first intensity photodiode PD7, the fourth EVS photodiode EVS_PD3, and the fourth intensity photodiode PD2. The AMP1_D transistor is located adjacent to and between the first EVS photodiode EVS1, the second EVS photodiode EVS_PD2, the third EVS photodiode EVS_PD3, and the fourth EVS photodiode EVS_PD4. The AMP2_D transistor is located adjacent to and between the first EVS photodiode EVS_PD1, the second EVS photodiode EVS_PD2, the first intensity photodiode PD6, and the second intensity photodiode PD5.

The plurality of selection transistors includes a first selection transistor SEL1 and a second selection transistors SEL2. The first selection transistor SEL1 is located adjacent to and between the third intensity photodiode PD3 and the third intensity photodiode PD1. The second selection transistor SEL2 is located adjacent to and between the second EVS photodiode EVS_PD2 and the fourth EVS photodiode EVS_PD4.

The plurality of LGT transistors includes a first LGT transistor LGT1 and a second LGT transistor LGT2. The first LGT transistor LGT1 is located adjacent to the second intensity photodiode PD4 and the sixth intensity photodiode PD6. The second LGT transistor LGT2 is located adjacent to and between the third EVS photodiode EVS_PD3, the fourth EVS photodiode EVS_PD4, the second intensity photodiode PD4, and the sixth intensity photodiode PD6.

The plurality of ALSEN transistors includes a first ALSEN transistor ALSEN0 and a second ALSEN transistor ALSEN1. The first ALSEN transistor ALSEN0 is located adjacent to the fifth intensity photodiode PD3. The second ALSEN transistor ALSEN1 is located adjacent to the sixth intensity photodiode PD6.

The reset transistor RST is located adjacent to the third intensity photodiode PD4. The FDI transistor is located adjacent to the fifth intensity photodiode PD3 and the second intensity photodiode PD4.

Figure 5:
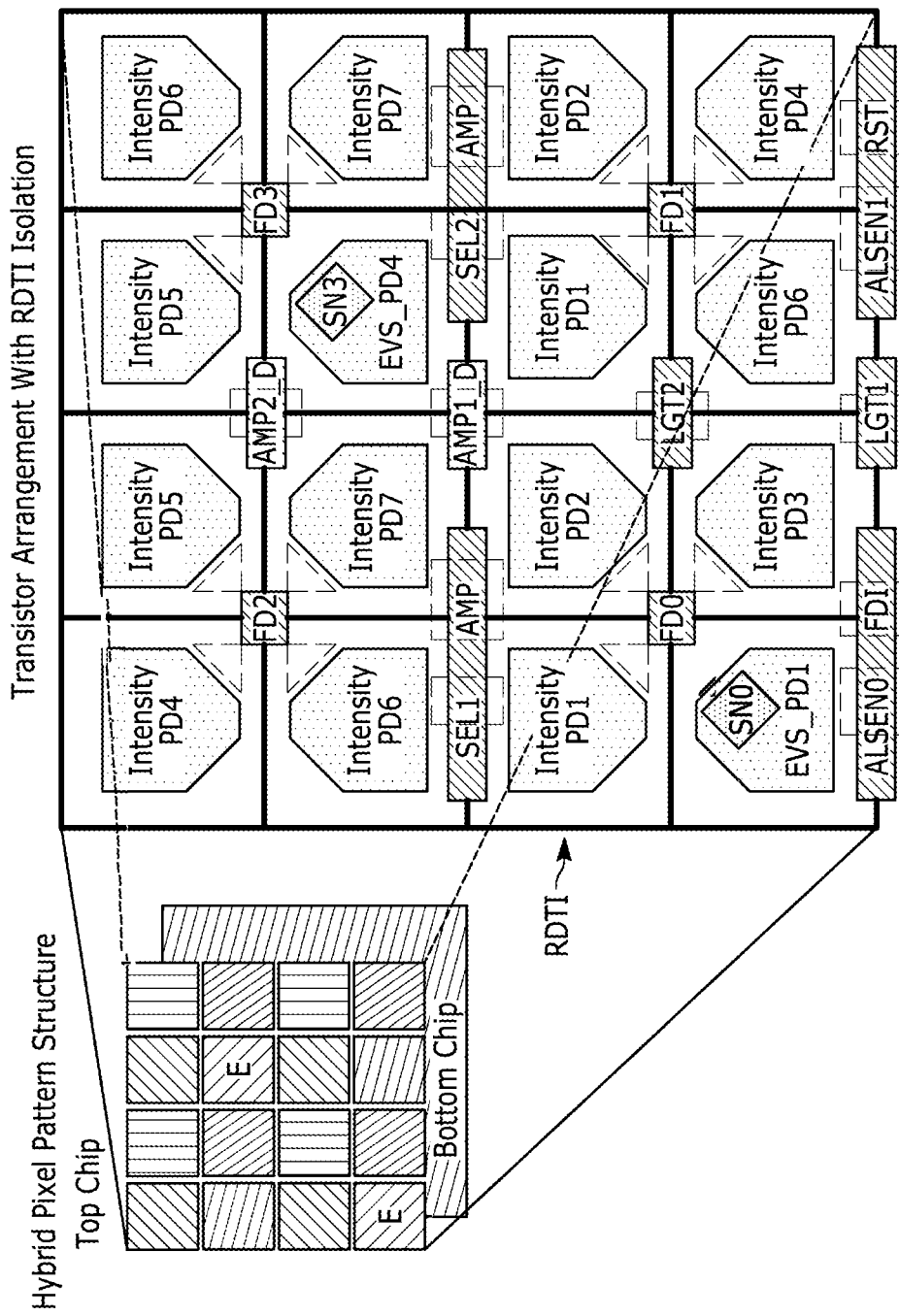
FIG. 5 is a diagram illustrating a third example transistor arrangement of a hybrid unit pixel in the example imaging sensor of FIG. 2 according to various aspects of the present disclosure.

FIG. 5 is a diagram illustrating a third example transistor arrangement 502 of a hybrid unit pixel 500 in the example imaging sensor 200 of FIG. 2 according to various aspects of the present disclosure. In the example of FIG. 5, the hybrid unit pixel 500 includes sixteen pixels that correspond to the pixel circuits 210 of FIG. 2, and the sixteen pixels are isolated from each other with rear deep trench isolation (RDTI).

The third example transistor arrangement 502 includes fourteen image pixels and two EVS pixels. Of the fourteen image pixels, the hybrid unit pixel 500 includes four red image pixels, six green image pixels, and four blue image pixels.

As illustrated FIG. 5, from left to right, a first row of the hybrid unit pixel 500 includes a first red image pixel, a first green image pixel, a second red image pixel, and a second green image pixel. A second row of the hybrid unit pixel 500 includes a third green image pixel, a first blue image pixel, a first EVS pixel, and a second blue image pixel. A third row of the hybrid unit pixel 500 includes a third red image pixel, a fourth green image pixel, a fourth red image pixel, and a fifth green image pixel. A fourth row of the hybrid unit pixel 500 includes a second EVS pixel, a third blue image pixel, a sixth green image pixel, and a fourth blue image pixel.

As illustrated in FIG. 5, from left to right, a first row of the third example transistor arrangement 502 includes a first intensity photodiode PD4, a first intensity photodiode PD5, a second intensity photodiode PD5, and a second intensity photodiode PD6. The first intensity photodiode PD4 and the second intensity photodiode PDS correspond to red image pixels and the first intensity photodiode PDS and the second intensity photodiode PD6 correspond to green image pixels. The first intensity photodiode PD4 and the first intensity PDS have gates that share a floating diffusion FD2. The second intensity photodiode PDS and the second intensity PD6 have gates that share a floating diffusion FD3.

As illustrated in FIG. 5, from left to right, a second row of the third example transistor arrangement 502 includes a third intensity photodiode PD6, a first intensity photodiode PD7, a first EVS photodiode EVS_PD4, and a second intensity photodiode PD7. The third intensity photodiodes PD6 corresponds to a green image pixel. The intensity photodiodes PD7 correspond to blue image pixels. The first EVS photodiode EVS_PD4 corresponds to a EVS pixel. The first EVS photodiode EVS_PD4 includes a sense node SN3.

The third intensity photodiode PD6 and the first intensity photodiode PD7 have gates that share the floating diffusion FD2 with the gates of the first intensity photodiode PD4 and the first intensity photodiode PDS. The second intensity photodiode PD7 has a gate that shares the floating diffusion FD3 with the gates of the second intensity photodiode PDS and the second intensity photodiode PD6.

As illustrated in FIG. 5, from left to right, a third row of the third example transistor arrangement 502 includes a third intensity photodiode PD1, a fourth intensity photodiode PD2, a fourth intensity photodiode PD1, and a fourth intensity photodiode PD2. The intensity photodiodes PD1 correspond to red image pixels and the intensity photodiodes PD2 correspond to green image pixels. The third intensity photodiode PD1 and the third intensity PD2 have gates that share a floating diffusion FD0. The fourth intensity photodiode PD1 and the fourth intensity PD2 have gates that share a floating diffusion FD1.

As illustrated in FIG. 5, from left to right, a fourth row of the third example transistor arrangement 502 includes a second EVS photodiode EVS_PD1, a third intensity photodiode PD3, a sixth intensity photodiode PD6, and a fourth intensity photodiode PD3. The intensity photodiodes PD3 correspond to blue image pixels. The intensity photodiode PD6 corresponds to a green image pixel. The second EVS photodiode EVS_PD1 corresponds to a EVS pixel. The EVS photodiode EVS_PD1 includes a sense node SN0.

The third intensity photodiode PD3 has a gate that shares the floating diffusion FD0 with the gates of the third intensity photodiode PD1 and the third intensity photodiode PD2. The sixth intensity photodiode PD6 and the fourth intensity photodiode PD3 have gates that share the floating diffusion FD1 with the gates of the fourth intensity photodiode PD1 and the fourth intensity photodiode PD2.

As illustrated in FIG. 5, the third example transistor arrangement 502 includes a plurality of AMP transistors, a plurality of LGT transistors, a plurality of selection transistors, a plurality of ALSEN transistors, a FDI transistor, and a reset transistor. The plurality of AMP transistors includes a first AMP transistor, a second AMP transistor, a AMP1_D transistor, and a AMP2_D transistor that are located over the RDTI.

The first AMP transistor is located adjacent to and between the third intensity photodiode PD6, the first intensity photodiode PD7, the third intensity photodiode PD1, and the third intensity photodiode PD2. The second AMP transistor is located adjacent to and between the first EVS photodiode EVS_PD4, the second intensity photodiode PD7, the fourth intensity photodiode PD1, and the fifth intensity photodiode PD2. The AMP1_D transistor is located adjacent to and between the first EVS photodiode EVS_PD4, the first intensity photodiode PD7, the third intensity photodiode PD2, and the fourth intensity photodiode PD1. The AMP2_D transistor is located adjacent to and between the first EVS photodiode EVS_PD4, the first intensity photodiode PD5, the second intensity photodiode PD5, and the first intensity photodiode PD7.

The plurality of selection transistors includes a first selection transistor SEL1 and a second selection transistors SEL2. The first selection transistor SEL1 is located adjacent to and between the third intensity photodiode PD6 and the third intensity photodiode PD1. The second selection transistor SEL2 is located adjacent to and between the first EVS photodiode EVS_PD4 and the fourth intensity photodiode PD1.

The plurality of LGT transistors includes a first LGT transistor LGT1 and a second LGT transistor LGT2. The first LGT transistor LGT1 is located adjacent to the third intensity photodiode PD3 and the sixth intensity photodiode PD6. The second LGT transistor LGT2 is located adjacent to and between the fourth intensity photodiode PD2, the fourth intensity photodiode PD1, the third intensity photodiode PD3, and the sixth intensity photodiode PD6.

The plurality of ALSEN transistors includes a first ALSEN transistor ALSEN0 and a second ALSEN transistor ALSEN1. The first ALSEN transistor ALSEN0 is located adjacent to the second EVS photodiode EVS_PD1. The second ALSEN transistor ALSEN1 is located adjacent to the sixth intensity photodiode PD6.

The reset transistor RST is located adjacent to the fourth intensity photodiode PD4. The FDI transistor is located adjacent to the second EVS photodiode EVS_PD1 and the third intensity photodiode PD3.

Figure 6:
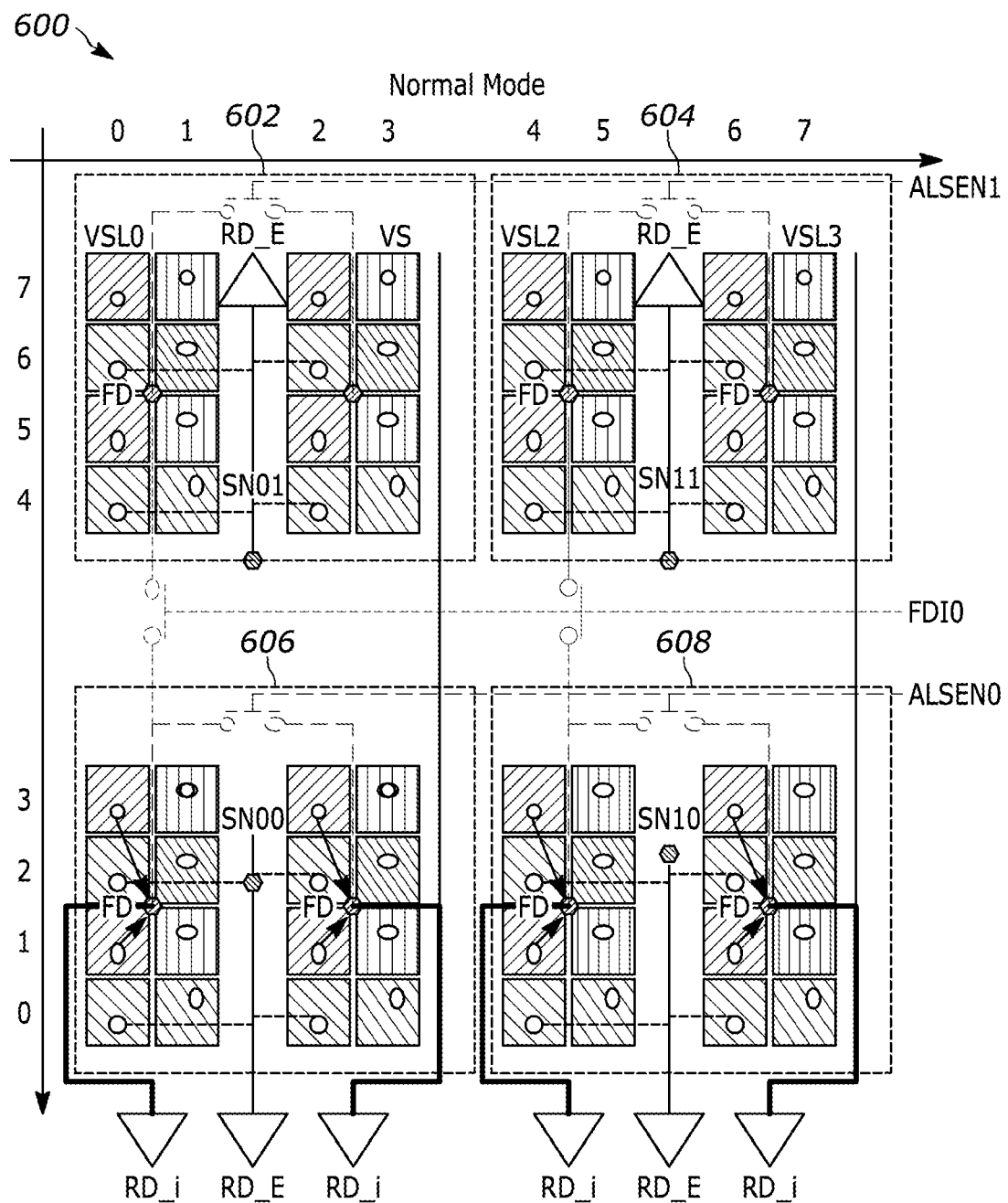
FIG. 6 is a diagram illustrating an example normal binning mode of four hybrid unit pixels according to various aspects of the present disclosure.

FIG. 6 is a diagram illustrating an example normal binning mode 600 of four hybrid unit pixels 602-608 according to various aspects of the present disclosure. In the example of FIG. 6, each of the four hybrid unit pixels 602-608 corresponds to the hybrid unit pixel 300 of FIG. 3.

In the example normal binning mode 600, floating diffusions internal to the four hybrid unit pixels 602-608 may be programmed to be binned together. For example, floating diffusions of the same pixel colors may be binned together. As illustrated in the hybrid unit pixels 606 and 608, two red pixels may be binned together and the shared floating diffusion of the two red pixels may be readout.

Figure 7:
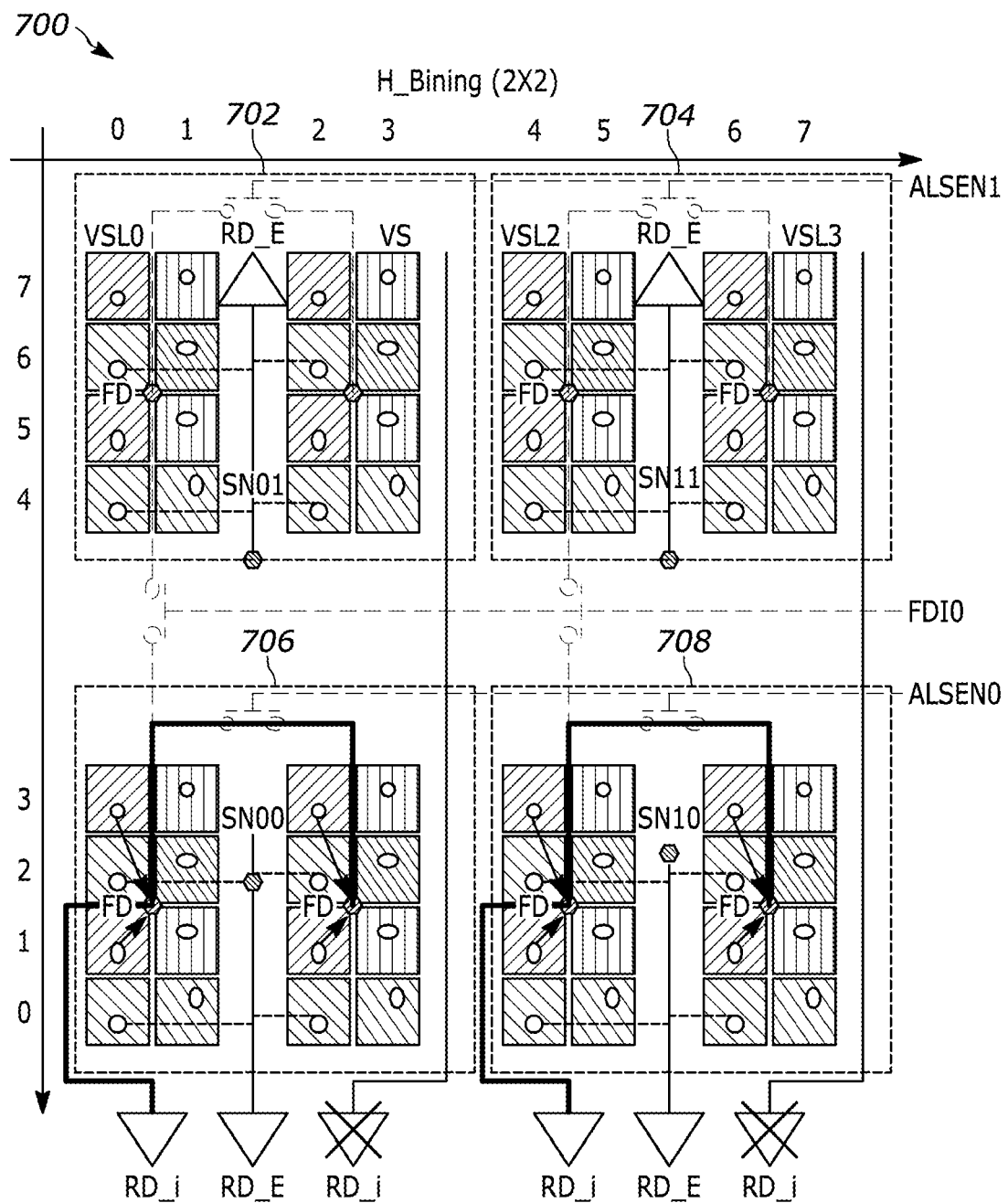
FIG. 7 is a diagram illustrating an example horizontal binning mode of four hybrid unit pixels according to various aspects of the present disclosure.

FIG. 7 is a diagram illustrating an example horizontal binning mode 700 of four hybrid unit pixels 702-708 according to various aspects of the present disclosure. In the example of FIG. 7, each of the four hybrid unit pixels 702-708 corresponds to the hybrid unit pixel 300 of FIG. 3.

Similar to the example normal binning mode 600, in the example horizontal binning mode 700, floating diffusions internal to the four hybrid unit pixels 702-708 may be programmed to be binned together. For example, floating diffusions of the same pixel colors may be binned together. As illustrated in hybrid unit pixels 706 and 708, two red pixels may be binned together and the shared floating diffusion of the two red pixels may be readout.

However, unlike the example normal binning mode 600, the example horizontal binning mode 700 also bins together (electrically connects) two adjacent floating diffusions with the ALSEN transistor. In other words, when an ALSEN0 transistor is in an ON state, then two adjacent floating diffusions are connected together. As illustrated in the hybrid unit pixels 706 and 708, the four red pixels in each of the hybrid unit pixels 706 and 708 are binned together and readout together. In this example, the number of column reads for imaging pixels decreases when the horizontal binning is enabled.

Figure 8:
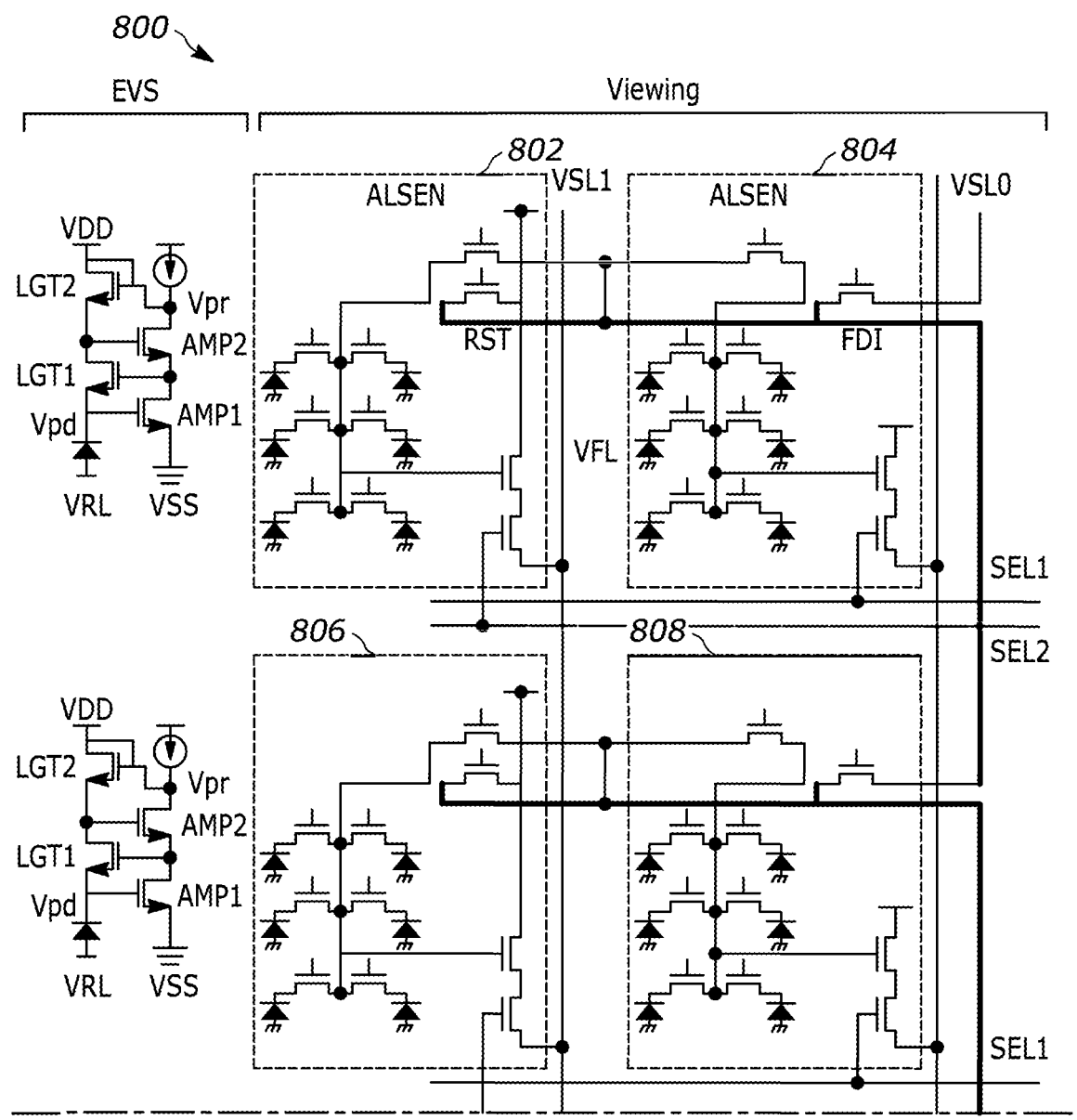
FIG. 8 is a circuit illustrating an example vertical binning mode of four hybrid unit pixels according to various aspects of the present disclosure.
Figure 8:
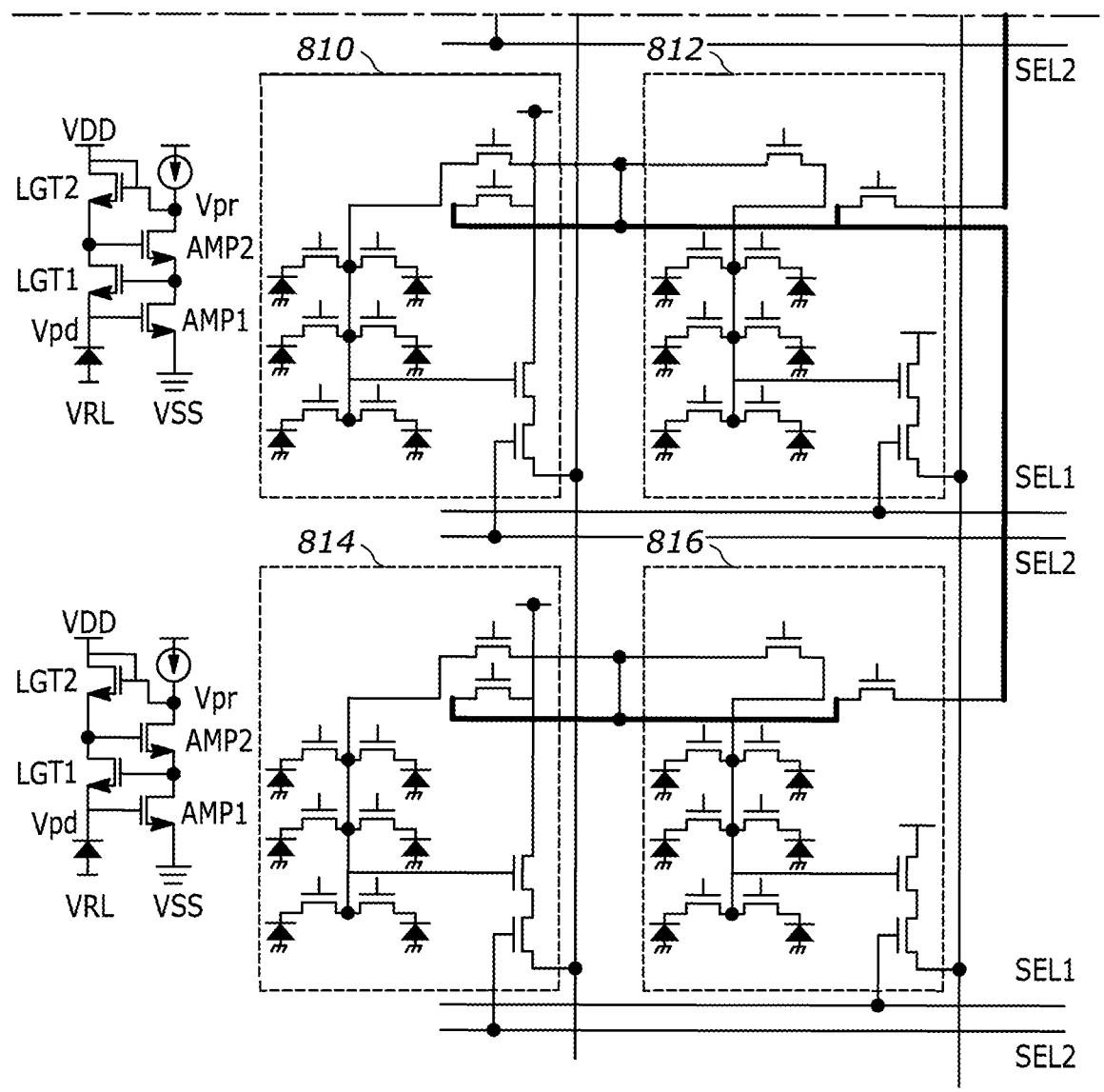

FIG. 8 is a circuit illustrating an example vertical binning mode 800 of four hybrid unit pixels 802-808 according to various aspects of the present disclosure. In the example of FIG. 8, the four hybrid unit pixels 802-808 include imaging pixels that correspond to imaging pixels in the hybrid unit pixels 300-500 of FIGS. 3-5. As illustrated in FIG. 8, in the example vertical binning mode 800, the four hybrid unit pixels 802-808 have floating diffusions that are vertically binned together because the FDI transistor in each of the four hybrid unit pixels 802-808 is in an ON state.

Figure 9:
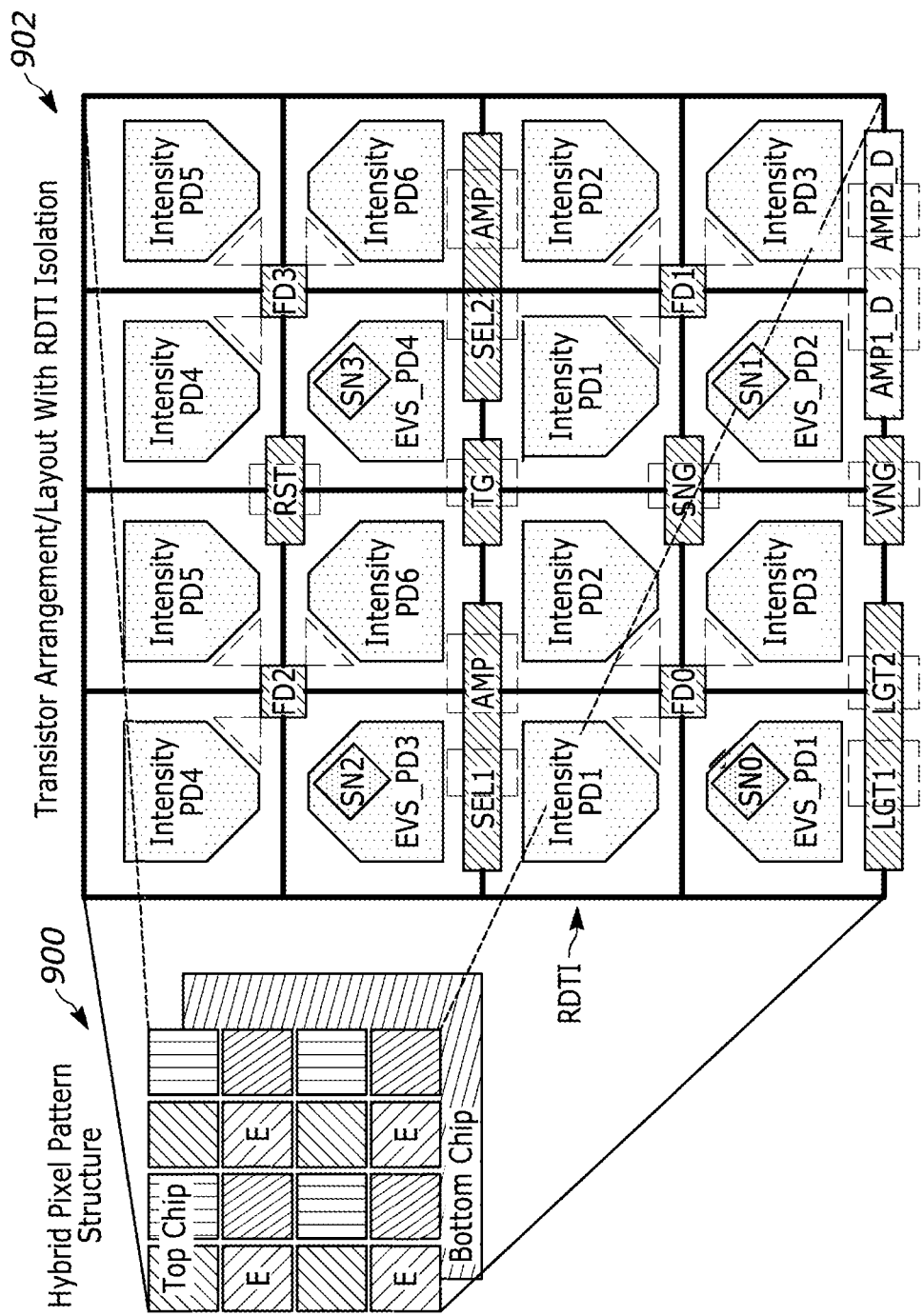
FIG. 9 is a diagram illustrating a fourth example transistor arrangement of a hybrid unit pixel in the example imaging sensor of FIG. 2 according to various aspects of the present disclosure.

FIG. 9 is a diagram illustrating a fourth example transistor arrangement 902 of a hybrid unit pixel 900 in the example imaging sensor 200 of FIG. 2 according to various aspects of the present disclosure. In the example of FIG. 9, the hybrid unit pixel 900 includes sixteen pixels that correspond to the pixel circuits 210 of FIG. 2, and the sixteen pixels are isolated from each other with rear deep trench isolation (RDTI).

In particular, the hybrid unit pixel 900 includes twelve image pixels and four EVS pixels. Of the twelve image pixels, the hybrid unit pixel 900 includes four red image pixels, four green image pixels, and four blue image pixels.

The hybrid unit pixel 900 is similar to the hybrid pixel unit 300. Consequently, the description of the hybrid unit pixel 300 applies to the hybrid unit pixel 900 and redundant description between the hybrid unit pixel 300 and the hybrid unit pixel 900 is not repeated herein. For example, the imaging pixels, the EVS pixels, and the plurality of selection transistors remain similar between the hybrid unit pixel 300 and the hybrid unit pixel 900.

The differences between the hybrid unit pixel 300 and the hybrid unit pixel 900 is the type and location of transistors adjacent to the imaging pixels and the EVS pixels. For example, in the hybrid unit pixel 900, a LGT1 transistor and a LGT2 transistor are located in the location of the ALSEN transistor and the FDI transistor of the hybrid unit pixel 300. Additionally, in the hybrid unit pixel 900, an AMP1_D transistor and an AMP2_D transistor are located in the location of the ALSEN transistor and the reset transistor of the hybrid unit pixel 300. Further, in the hybrid unit pixel 900, a VNG transistor and an SNG transistor are located in the location of the LGT1 transistor and the LGT2 transistor of the hybrid pixel 300, respectively. Lastly, in the hybrid unit pixel 900, the reset transistor and a TG transistor are located in the location of the AMP2_D transistor and the AMP1_D transistor of the hybrid pixel 300.

Additionally, a second hybrid unit pixel is located directly adjacent to the hybrid unit pixel 900, where the second hybrid unit is in a different column and does not share a column readout with the hybrid unit pixel 900. The second hybrid unit pixel may generally correspond to the hybrid unit pixel 900 except an FBG transistor is located in the place of the TG transistor.

The EVS pixels of the hybrid unit pixel 900 generate a photocurrent that flows into a logarithmic converter (LGT). During horizontal and vertical binning, only one logarithmic converter needs to be on to receive the photocurrent from all of the EVS pixels in the imaging sensor 200. The TG transistor (and the FBG transistor in the second hybrid unit pixel) acts as a switch for photocurrent from EVS pixels to flow into a logarithmic converter.

In the hybrid unit pixel 900, event pixels are distributed with symmetry and the sense nodes of the EVS pixels may be binned together in different combinations with the VNG transistor, the SNG transistor, and the TG transistor (and the FBG transistor with respect to the second hybrid unit pixel).

Figure 10:
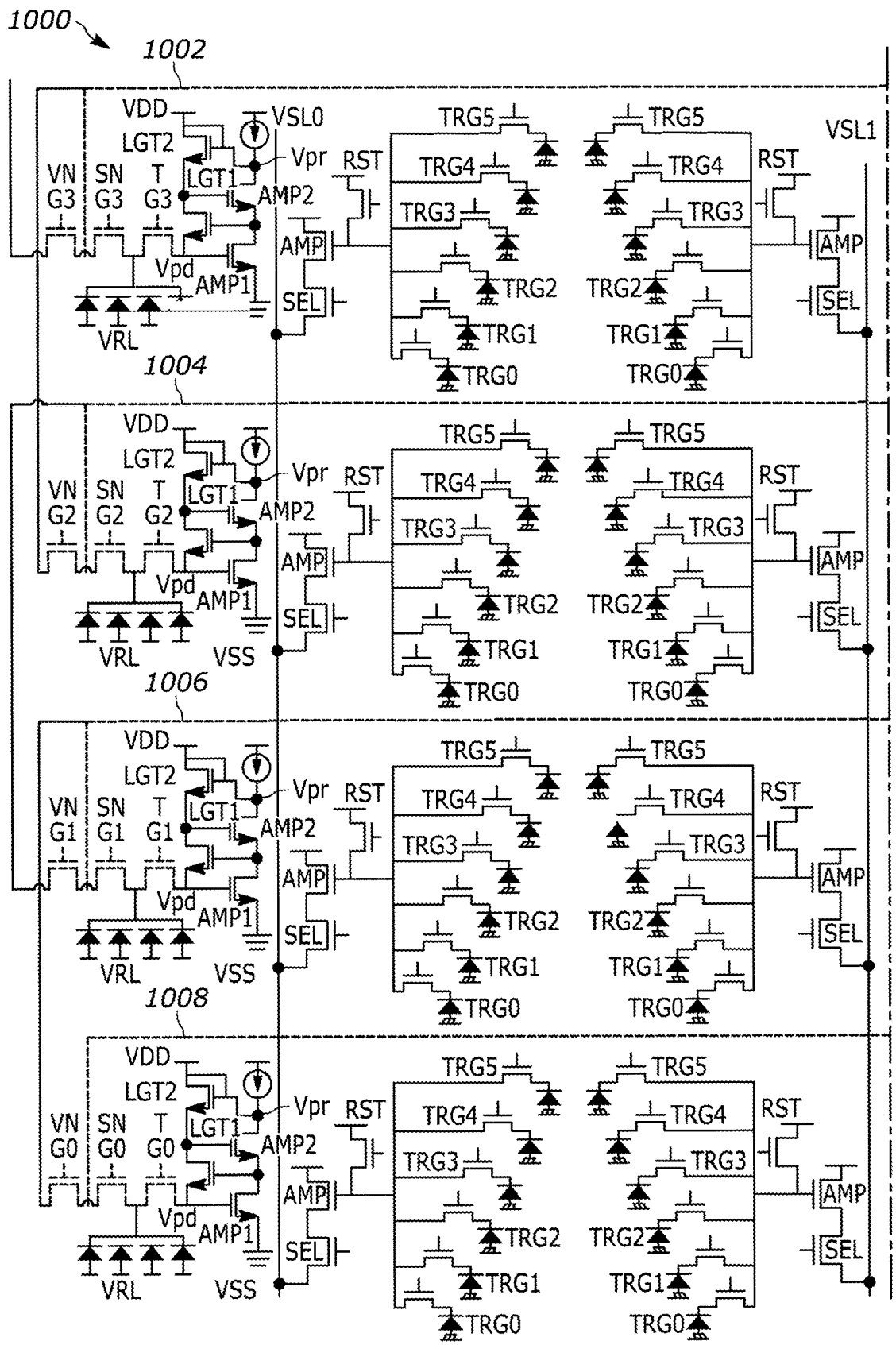
FIG. 10 is a circuit illustrating an example horizontal and vertical binning mode of eight hybrid unit pixels according to various aspects of the present disclosure.
Figure 10:
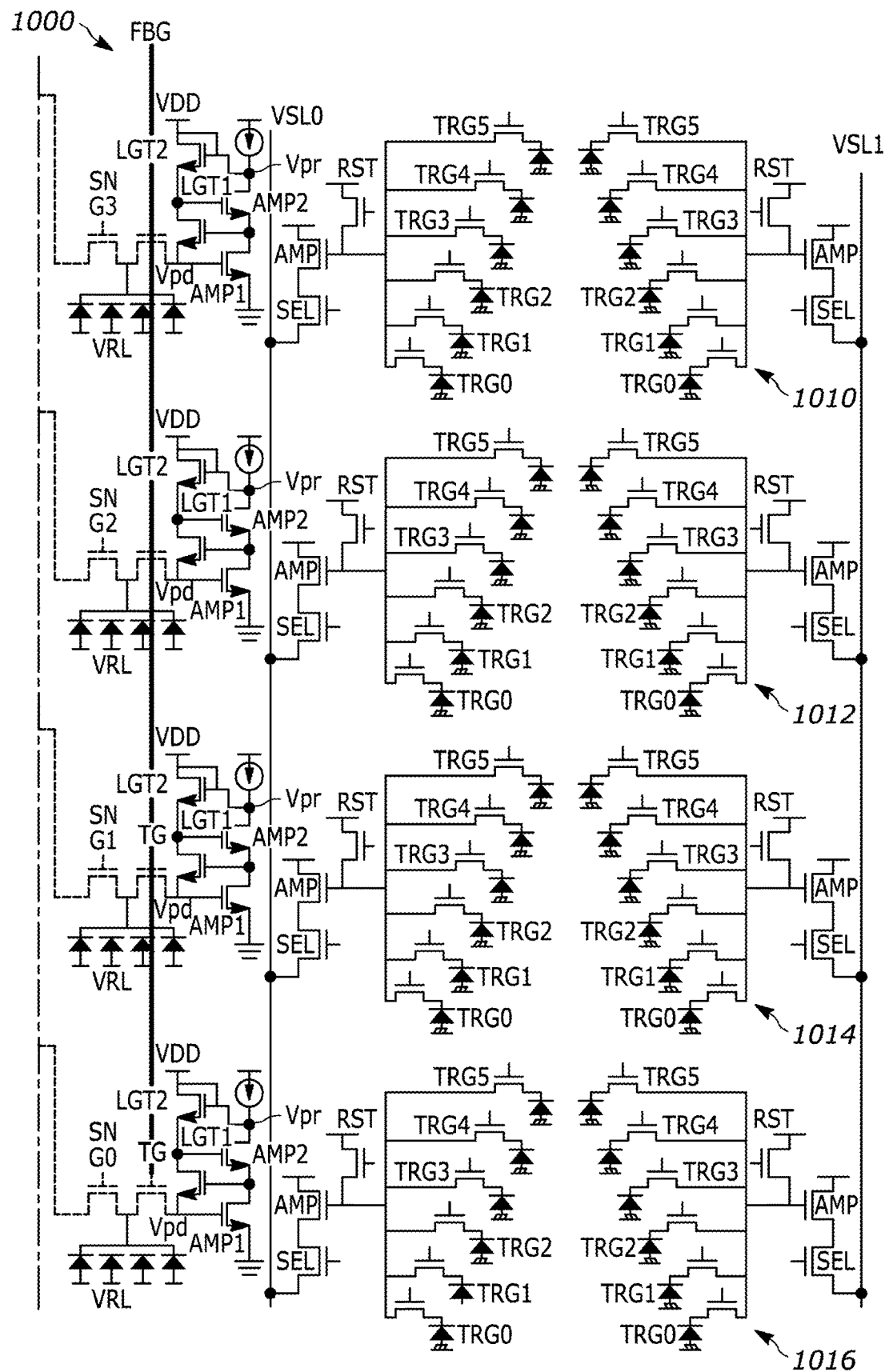

FIG. 10 is a circuit illustrating an example horizontal and vertical binning mode 1000 of eight hybrid unit pixels 1002-1016 according to various aspects of the present disclosure. In the example of FIG. 10, the eight hybrid unit pixels 1002-1016 include EVS pixels that correspond to EVS pixels in the hybrid unit pixel 900 of FIG. 9.

As illustrated in FIG. 10, in the example horizontal and vertical binning mode 1000, the eight hybrid unit pixels 1002-1016 have sense nodes that are vertically and horizontally binned together because the SNG transistor and the VNG transistor in each of the eight hybrid unit pixels 1002-1016 are controlled (e.g., externally controlled) to be in an ON state. In the example of FIG. 10, only one of the TG transistors and the FBG transistors is turned ON because during binning only one logarithmic converter needs to be on. However, more than one of the TG transistors and the FBG transistors may be turned ON when different subsets of the sense nodes are binned together and more than one of the logarithmic converters is used to receive the photocurrent from the different subsets of the sense nodes that are binned together. In some examples, when all SNG transistors and all VNG transistor are turned on, then all EVS pixels in the sensor chip (e.g., the imaging sensor 200) may be binned to together to generate single EVS output.

In one example of FIG. 10, the fourth hybrid unit pixel 1008 includes a TG transistor TG0, a SNG transistor SNG0, and a VNG transistor VNG0, and the third hybrid unit pixel 1006 includes a TG transistor TG1, a SNG transistor SNG1, and a VNG transistor VNG1. When the TG transistor TG0 is off, the TG transistor TG1 is on, the SNG transistors SNG0 and SNG1 are on, and the VNG transistor VNG0 is on, then the photocurrent from third hybrid unit pixel 1006 is added to the photocurrent of the fourth hybrid unit pixel 1008 and transferred to logarithmic convertor associated with the fourth hybrid unit pixel 1008.

In the example horizontal and vertical binning mode 1000, photocurrents are summed up (e.g., in two row/column (left/right, top/bottom neighbor pixels)) and are transferred to a logarithmic convertor. When the photocurrents are summed up, the output voltage increases and the ratio of signal-to-noise/background increases. Therefore, in the example horizontal and vertical binning mode 1000, the probability of an event detection is enhanced in typical contrast and in low light compared to a normal, non-binning mode.

Additionally or alternatively, in some examples, the eight hybrid unit pixels 1002-1016 have sense nodes that may be vertically binned together because the VNG transistor in each of the eight hybrid unit pixels 1002-1016 are controlled (e.g., externally controlled) to be in an ON state. However, in these examples, the eight hybrid unit pixels 1002-1016 have sense nodes that may not be horizontally binned together because the SNG transistor in each of the eight hybrid unit pixels 1002-1016 are controlled (e.g., externally controlled) to be in an OFF state. In other words, while FIG. 10 illustrates the example horizontal and vertical binning mode 1000 of the eight hybrid unit pixels 1002-1016, the eight hybrid unit pixels 1002-1016 also have a vertical only binning mode.

Figure 11:
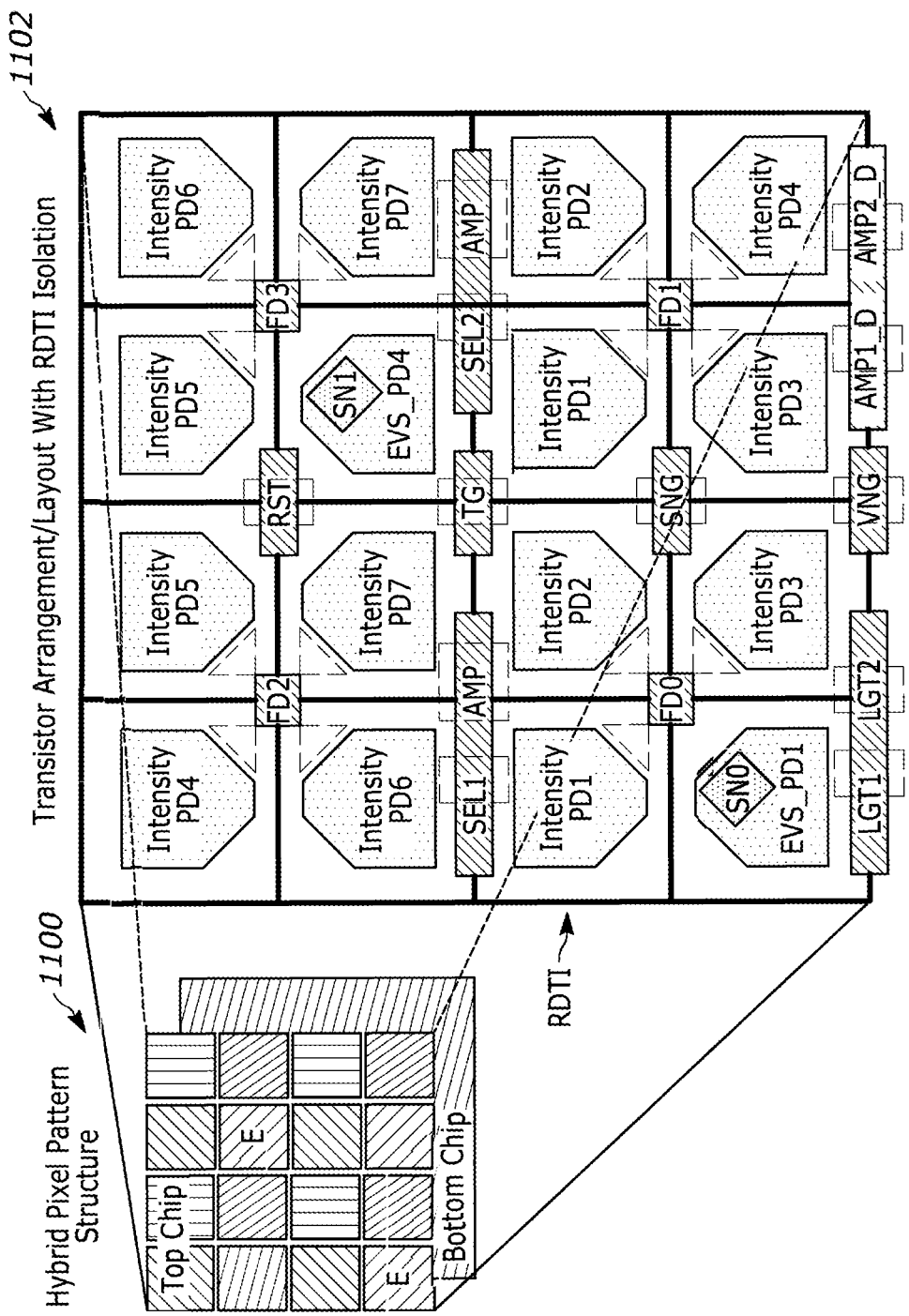
FIG. 11 is a diagram illustrating a fifth example transistor arrangement of a hybrid unit pixel in the example imaging sensor of FIG. 2 according to various aspects of the present disclosure.

FIG. 11 is a diagram illustrating a fifth example transistor arrangement 1102 of a hybrid unit pixel 1100 in the example imaging sensor 200 of FIG. 2 according to various aspects of the present disclosure. In the example of FIG. 11, the hybrid unit pixel 1100 includes sixteen pixels that correspond to the pixel circuits 210 of FIG. 2, and the sixteen pixels are isolated from each other with rear deep trench isolation (RDTI).

In particular, the hybrid unit pixel 1100 includes fourteen image pixels and two EVS pixels. Of the fourteen image pixels, the hybrid unit pixel 1100 includes four red image pixels, six green image pixels, and four blue image pixels.

The hybrid unit pixel 1100 is similar to the hybrid pixel unit 500. Consequently, the description of the hybrid unit pixel 500 applies to the hybrid unit pixel 1100 and redundant description between the hybrid unit pixel 500 and the hybrid unit pixel 1100 is not repeated herein. Additionally, while the hybrid unit pixel 1100 is similar to the hybrid pixel unit 500, the hybrid unit pixel 1100 has the same transistor configuration as the hybrid unit pixel 900. Therefore, the description of the hybrid unit pixel 900 applies to the hybrid unit pixel 1100 and redundant description between the hybrid unit pixel 900 and the hybrid unit pixel 1100 is not repeated herein.

Additionally, the example horizontal and vertical binning mode 1000 of FIG. 10 is also applicable to the fifth example transistor arrangement 1102. The main difference being the binning of two sense nodes per hybrid unit pixel instead of four sense nodes.

Figure 12:
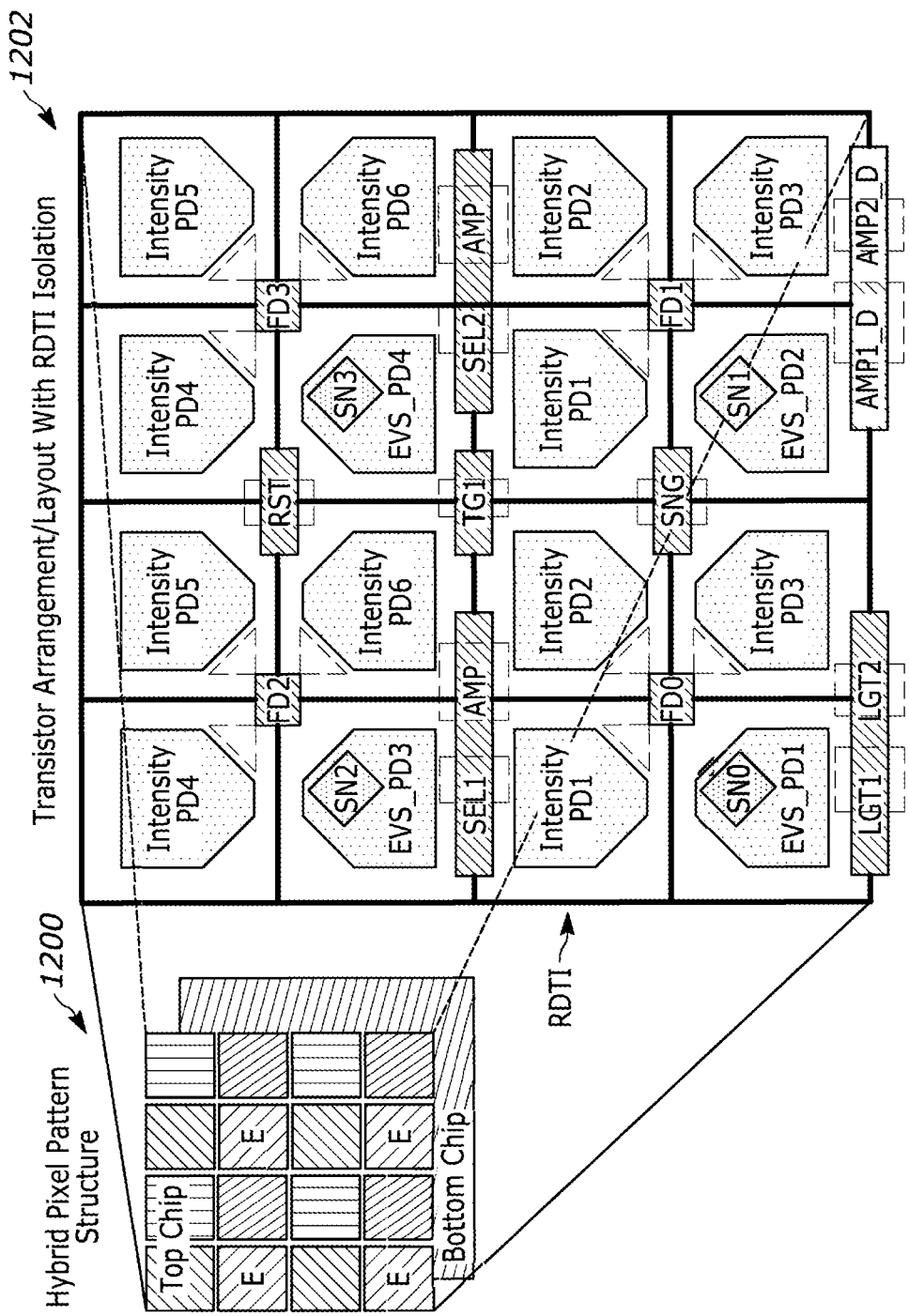
FIG. 12 is a diagram illustrating a sixth example transistor arrangement of a hybrid unit pixel in the example imaging sensor of FIG. 2 according to various aspects of the present disclosure.

FIG. 12 is a diagram illustrating a sixth example transistor arrangement 1202 of a hybrid unit pixel 1200 in the example imaging sensor 200 of FIG. 2 according to various aspects of the present disclosure. In the example of FIG. 12, the hybrid unit pixel 1200 includes sixteen pixels that correspond to the pixel circuits 210 of FIG. 2, and the sixteen pixels are isolated from each other with rear deep trench isolation (RDTI).

In particular, the hybrid unit pixel 1200 includes twelve image pixels and four EVS pixels. Of the twelve image pixels, the hybrid unit pixel 1200 includes four red image pixels, four green image pixels, and four blue image pixels.

The hybrid unit pixel 1200 is similar to the hybrid unit pixel 300. Consequently, the description of the hybrid unit pixel 300 applies to the hybrid unit pixel 1200 and redundant description between the hybrid unit pixel 300 and the hybrid unit pixel 1200 is not repeated herein. Additionally, while the hybrid unit pixel 1200 is similar to the hybrid pixel unit 300, the hybrid unit pixel 1200 has a transistor configuration that is similar to, but slightly different from, the hybrid unit pixel 900. Therefore, the description of the hybrid unit pixel 900 applies to the hybrid unit pixel 1200 and redundant description between the hybrid unit pixel 900 and the hybrid unit pixel 1200 is not repeated herein.

The difference between the hybrid unit pixel 900 and the hybrid unit pixel 1200 is the elimination of the VNG transistor. By eliminating the VNG transistor, the sense nodes of the hybrid unit pixel 1200 cannot be binned in the vertical direction. However, the sense nodes of the hybrid unit pixel 1200 may still be binned in the horizontal direction with the SNG transistor.

Figure 13:
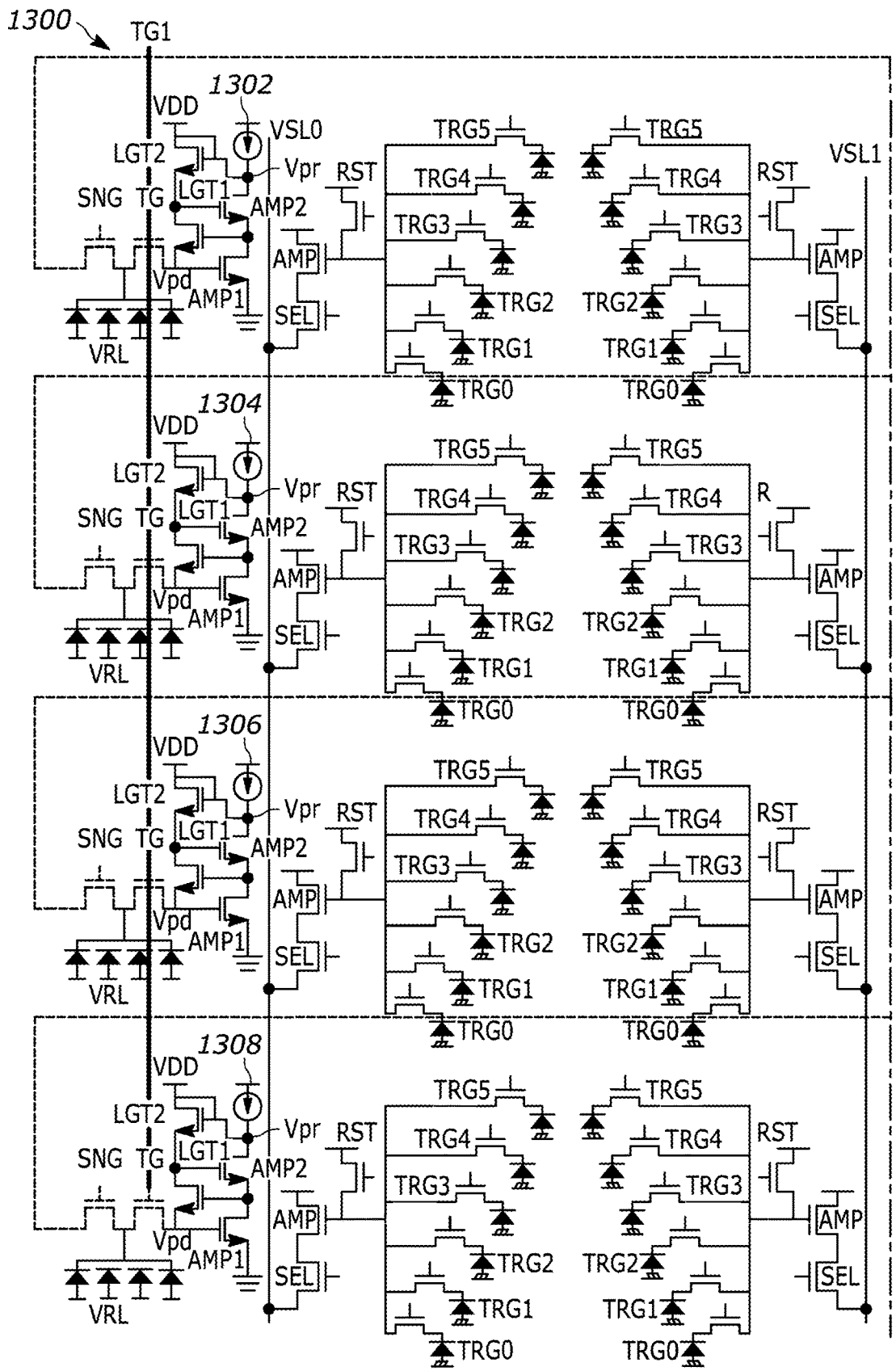
FIG. 13 is a circuit illustrating an example horizontal binning mode of eight hybrid unit pixels according to various aspects of the present disclosure.
Figure 13:
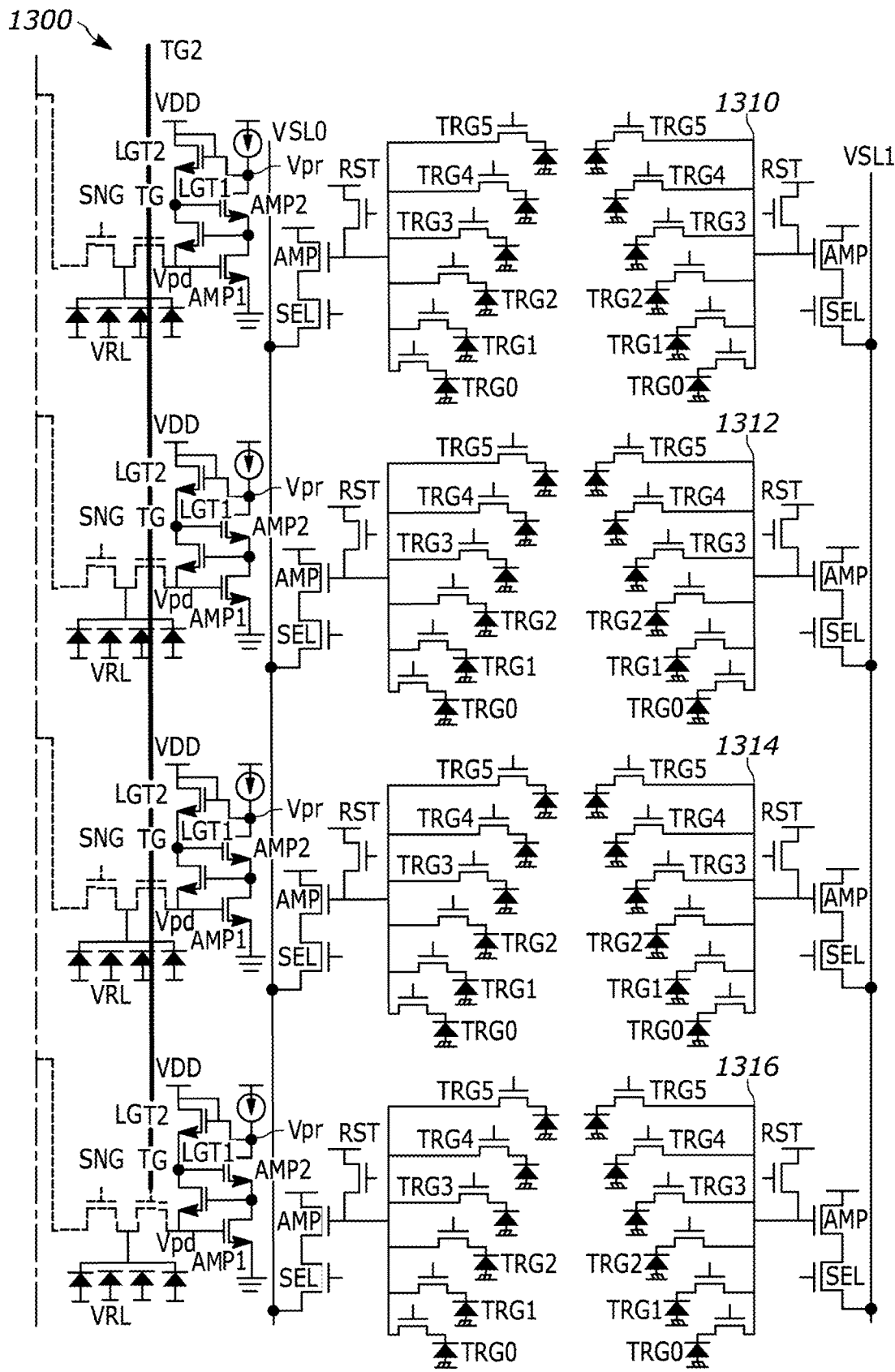

FIG. 13 is a circuit illustrating an example horizontal binning mode 1300 of eight hybrid unit pixels 1302-1316 according to various aspects of the present disclosure. In the example of FIG. 13, the eight hybrid unit pixels 1302-1316 include EVS pixels that correspond to EVS pixels in the hybrid unit pixel 1200 of FIG. 12.

As illustrated in FIG. 13, in the example horizontal binning mode 1300, the eight hybrid unit pixels 1302-1316 have sense nodes that are horizontally binned together because the SNG transistor (there is no VNG transistor) in each of the eight hybrid unit pixels 1302-1316 is controlled (e.g., externally controlled) to be in an ON state. In the example of FIG. 13, one of the TG transistors in each row is turned ON because during binning only one logarithmic converter needs to be on for each row. In some examples, when all SNG transistors are turned on, then all EVS pixels in the sensor chip (e.g., the imaging sensor 200) may be binned to together on a row-by-row basis to generate a plurality of EVS outputs from each row.

In the example horizontal binning mode 1300, the TG transistor of the hybrid unit pixel 1302 is off while the TG transistor of the hybrid unit pixel 1310 is on and the SNG transistors of both the hybrid unit pixels 1302 and 1310 are on. The photocurrent at a sense node of the hybrid unit pixel 1302 is transferred from the hybrid unit pixel 1302 to a sense node of the hybrid unit pixel 1310.

The SNG control signal is horizontal signal, and should be always on during binning mode, and always off in normal mode. The TG control signals are vertical signals and are always on in normal mode. One of the TG control signals is off in binning mode and may be used to control the resolution of the EVS pixels in the imaging sensor 200.

The left and right photocurrent are summed up and transferred to a logarithmic convertor. The output voltage at each row increases and the ratio of signal-to-noise/background increases as well. Therefore, in the example horizontal binning mode 1300, the probability of an event detection is enhanced in typical contrast and in low light compared to a normal, non-binning mode.

Figure 14:
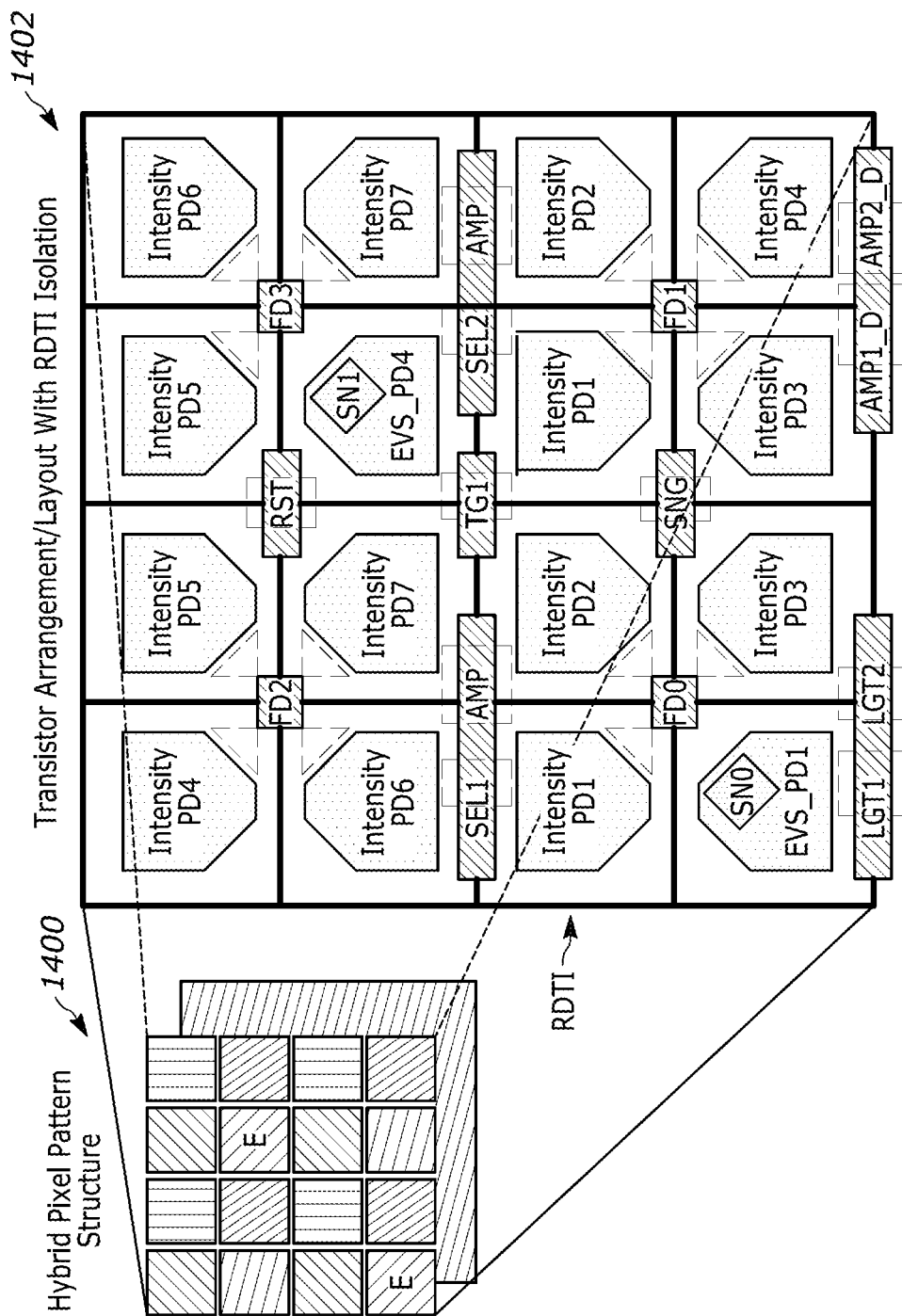
FIG. 14 is a diagram illustrating a seventh example transistor arrangement of a hybrid unit pixel in the example imaging sensor of FIG. 2 according to various aspects of the present disclosure.

FIG. 14 is a diagram illustrating a seventh example transistor arrangement 1402 of a hybrid unit pixel 1400 in the example imaging sensor 200 of FIG. 2 according to various aspects of the present disclosure. In the example of FIG. 14, the hybrid unit pixel 1400 includes sixteen pixels that correspond to the pixel circuits 210 of FIG. 2, and the sixteen pixels are isolated from each other with rear deep trench isolation (RDTI).

In particular, the hybrid unit pixel 1400 includes fourteen image pixels and two EVS pixels. Of the fourteen image pixels, the hybrid unit pixel 1400 includes four red image pixels, six green image pixels, and four blue image pixels.

The hybrid unit pixel 1400 is similar to the hybrid unit pixel 500. Consequently, the description of the hybrid unit pixel 500 applies to the hybrid unit pixel 1400 and redundant description between the hybrid unit pixel 500 and the hybrid unit pixel 1400 is not repeated herein. Additionally, while the hybrid unit pixel 1400 is similar to the hybrid pixel unit 500, the hybrid unit pixel 1400 has a transistor configuration that is similar to the hybrid unit pixel 1200. Therefore, the description of the hybrid unit pixel 1200 applies to the hybrid unit pixel 1400 and redundant description between the hybrid unit pixel 1200 and the hybrid unit pixel 1400 is not repeated herein.

The example horizontal binning mode 1300 of FIG. 13 is also applicable to the seventh example transistor arrangement 1402. The main difference being the binning of two sense nodes per hybrid unit pixel instead of four sense nodes.

Figure 15:
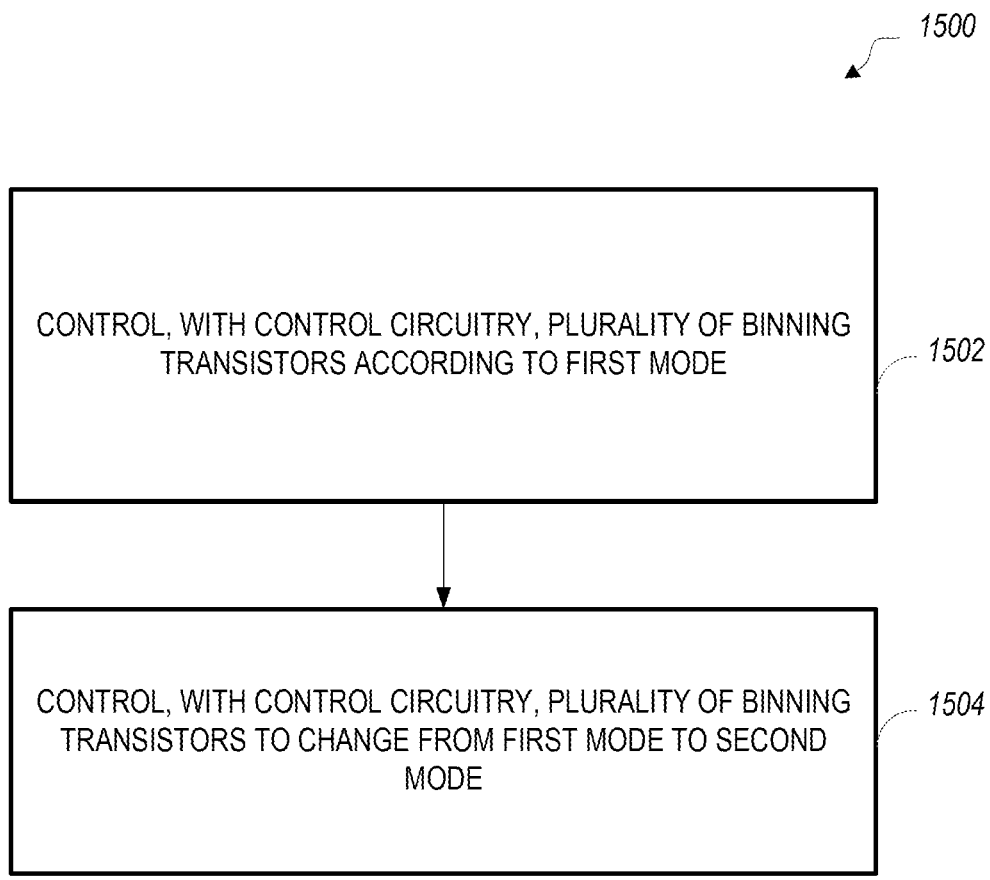
FIG. 15 is a flowchart illustrating a method according to various aspects of the present disclosure.

FIG. 15 is a flowchart illustrating a method 1500 according to various aspects of the present disclosure. The method includes controlling, with control circuitry, a plurality of binning transistors according to a first mode (at block 1502). The method also includes controlling, with the control circuitry, the plurality of binning transistors to change from the first mode to a second mode (at block 1504).

In the second mode, the plurality of binning transistors bins together at least one of a first portion of a plurality of pixel circuits in a pixel array or a second portion of the plurality of pixel circuits. The first portion of the plurality of pixel circuits individually includes an intensity photodiode and the second portion of the plurality of pixel circuits individually includes an event vision sensor (EVS) photodiode.

In some examples, the first mode is a non-binning mode, and in the non-binning mode, the plurality of binning transistors are in an OFF state.

In some examples, the second mode is a first binning mode and the plurality of binning transistors includes a plurality of SNG transistors, and in the first binning mode, the control circuitry controls the plurality of SNG transistors to horizontally bin together sense nodes of the second portion on a row-by-row basis of the pixel array.

In some examples, the plurality of binning transistors includes a plurality of VNG transistors. In these examples, in the first binning mode, the control circuitry controls the plurality of VNG transistors to vertically bin together the sense nodes of the second portion on a column-by-column basis of the pixel array.

In some examples, the second mode is a first binning mode and the plurality of binning transistors includes a plurality of ALSEN transistors. In the first binning mode, the control circuitry controls the plurality of ALSEN transistors to horizontally bin together floating diffusions of the first portion on a row-by-row basis of the pixel array.

In some examples, the plurality of binning transistors includes a plurality of VNG transistors. In these examples, in the first binning mode, the control circuitry controls the plurality of VNG transistors to vertically bin together the floating diffusions of the first portion on a column-by-column basis of the pixel array.

In some examples, the first mode is a first binning mode and the second mode is a second binning mode, and the plurality of binning transistors includes a plurality of SNG transistors. In these examples, in the first binning mode, the control circuitry controls the plurality of SNG transistors to horizontally bin together sense nodes of the second portion on a row-by-row basis of the pixel array.

In some examples, the plurality of binning transistors includes a plurality of VNG transistors. In the first binning mode, the control circuitry controls the plurality of VNG transistors to vertically bin together the sense nodes of the second portion on a column-by-column basis of the pixel array.

In some examples, the first mode is a first binning mode and the second mode is a second binning mode. In these examples, the plurality of binning transistors includes a plurality of ALSEN transistors, and in the first binning mode, the control circuitry controls the plurality of ALSEN transistors to horizontally bin together floating diffusions of the first portion on a row-by-row basis of the pixel array.

In some examples, the plurality of binning transistors includes a plurality of VNG transistors. In these examples, in the first binning mode, the control circuitry controls the plurality of VNG transistors to vertically bin together the floating diffusions of the first portion on a column-by-column basis of the pixel array.

The following enumerated examples are examples of the imaging sensors, methods, and electronic devices described herein. Example 1: an imaging sensor comprising: a pixel array including a plurality of pixel circuits; and a plurality of binning transistors, wherein a first portion of the plurality of pixel circuits individually includes an intensity photodiode and a second portion of the plurality of pixel circuits individually includes an event vision sensor (EVS) photodiode, and wherein the plurality of binning transistors is configured to bin together at least one of the first portion or the second portion.

Example 2: the imaging sensor according to Example 1, wherein the plurality of binning transistors includes a plurality of SNG transistors that horizontally bin together sense nodes of the second portion on a row-by-row basis of the pixel array.

Example 3: the imaging sensor according to any of Examples 1 or 2, wherein the plurality of binning transistors includes a plurality of VNG transistors that vertically bin together sense nodes of the second portion on a column-by-column basis of the pixel array.

Example 4: the imaging sensor according to any of Examples 1 through 3, wherein the plurality of binning transistors includes a plurality of ALSEN transistors that horizontally bin together floating diffusions of the first portion on a row-by-row basis of the pixel array.

Example 5: the imaging sensor according to any of Examples 1 through 4, wherein the plurality of binning transistors includes a plurality of FDI transistors that vertically bin together floating diffusions of the first portion on a column-by-column basis of the pixel array.

Example 6: the imaging sensor according to any of Examples 1 through 5, wherein the plurality of pixel circuits forms a hybrid unit pixel, wherein the first portion with respect to the hybrid unit pixel is twelve intensity photodiodes, wherein the second portion with respect to the hybrid unit pixel is four EVS photodiodes, and wherein each of the twelve intensity photodiodes has a gate that shares one of four floating diffusions.

Example 7: the imaging sensor according to any of Examples 1 through 6, wherein the plurality of pixel circuits forms a hybrid unit pixel, wherein the first portion with respect to the hybrid unit pixel is fourteen intensity photodiodes, wherein the second portion with respect to the hybrid unit pixel is four EVS photodiodes, and wherein each of the fourteen intensity photodiodes has a gate that shares one of four floating diffusions.

Example 8: the imaging sensor according to Example 7, wherein the fourteen intensity photodiodes includes four intensity photodiodes with a blue light filter, six intensity photodiodes with a green light filter, and four intensity photodiodes with a red light filter.

Example 9: a method comprising: controlling, with control circuitry, a plurality of binning transistors according to a first mode; and controlling, with the control circuitry, the plurality of binning transistors to change from the first mode to a second mode, wherein, in the second mode, the plurality of binning transistors bins together at least one of a first portion of a plurality of pixel circuits in a pixel array or a second portion of the plurality of pixel circuits, and wherein the first portion of the plurality of pixel circuits individually includes an intensity photodiode and the second portion of the plurality of pixel circuits individually includes an event vision sensor (EVS) photodiode.

Example 10: the method according to Example 9, wherein the first mode is a non-binning mode, and wherein, in the non-binning mode, the plurality of binning transistors are in an OFF state.

Example 11: the method according to any of Examples 9 or 10, wherein the second mode is a first binning mode and the plurality of binning transistors includes a plurality of SNG transistors, and wherein, in the first binning mode, the control circuitry controls the plurality of SNG transistors to horizontally bin together sense nodes of the second portion on a row-by-row basis of the pixel array.

Example 12: the method according to any of Examples 9 through 11, wherein the second mode is a first binning mode and the plurality of binning transistors includes a plurality of VNG transistors, wherein, in the first binning mode, the control circuitry controls the plurality of VNG transistors to vertically bin together sense nodes of the second portion on a column-by-column basis of the pixel array.

Example 13: the method according to any of Examples 9 through 12, wherein the second mode is a first binning mode and the plurality of binning transistors includes a plurality of ALSEN transistors, and wherein, in the first binning mode, the control circuitry controls the plurality of ALSEN transistors to horizontally bin together floating diffusions of the first portion on a row-by-row basis of the pixel array.

Example 14: the method according to Example 13, wherein the plurality of binning transistors includes a plurality of VNG transistors, wherein, in the first binning mode, the control circuitry controls the plurality of VNG transistors to vertically bin together the floating diffusions of the first portion on a column-by-column basis of the pixel array.

Example 15: the method according to any of Examples 9 through 14, wherein the first mode is a first binning mode and the second mode is a second binning mode, wherein the plurality of binning transistors includes a plurality of SNG transistors, and wherein, in the first binning mode, the control circuitry controls the plurality of SNG transistors to horizontally bin together sense nodes of the second portion on a row-by-row basis of the pixel array.

Example 16: the method according to Example 15, wherein the plurality of binning transistors includes a plurality of VNG transistors, and wherein, in the first binning mode, the control circuitry controls the plurality of VNG transistors to vertically bin together the sense nodes of the second portion on a column-by-column basis of the pixel array.

Example 17: the method according to any of Examples 9 through 16, wherein the first mode is a first binning mode and the second mode is a second binning mode, wherein the plurality of binning transistors includes a plurality of ALSEN transistors, and wherein, in the first binning mode, the control circuitry controls the plurality of ALSEN transistors to horizontally bin together floating diffusions of the first portion on a row-by-row basis of the pixel array.

Example 18: the method according to Example 17, wherein the plurality of binning transistors includes a plurality of VNG transistors, wherein, in the first binning mode, the control circuitry controls the plurality of VNG transistors to vertically bin together the floating diffusions of the first portion on a column-by-column basis of the pixel array.

Example 19: an electronic device comprising: a pixel array including a plurality of pixel circuits; and a plurality of binning transistors, wherein a first portion of the plurality of pixel circuits individually includes an intensity photodiode and a second portion of the plurality of pixel circuits individually includes an event vision sensor (EVS) photodiode, and wherein the plurality of binning transistors are configured to bin together at least one of the first portion or the second portion.

Example 20: the electronic device according to Example 19, wherein the plurality of binning transistors includes a plurality of SNG transistors that are configured to horizontally bin together sense nodes of the second portion on a row-by-row basis of the pixel array.

Conclusion

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An imaging sensor comprising:
a pixel array including a plurality of pixel circuits; and
a plurality of binning transistors,
wherein a first portion of the plurality of pixel circuits individually includes two or more intensity photodiodes and a second portion of the plurality of pixel circuits individually includes two or more event vision sensor (EVS) photodiodes that are separate and distinct from the two or more intensity photodiodes, and wherein the plurality of binning transistors is configured to bin together the first portion, bin together the second portion, and bin together the first portion and bin together the second portion, respectively.

2. The imaging sensor according to claim 1, wherein the plurality of binning transistors includes a plurality of SNG transistors that horizontally bin together sense nodes of the second portion on a row-by-row basis of the pixel array.

3. The imaging sensor according to claim 1, wherein the plurality of binning transistors includes a plurality of VNG transistors that vertically bin together sense nodes of the second portion on a column-by-column basis of the pixel array.

4. The imaging sensor according to claim 1, wherein the plurality of binning transistors includes a plurality of ALSEN transistors that horizontally bin together floating diffusions of the first portion on a row-by-row basis of the pixel array.

5. The imaging sensor according to claim 1, wherein the plurality of binning transistors includes a plurality of FDI transistors that vertically bin together floating diffusions of the first portion on a column-by-column basis of the pixel array.

6. The imaging sensor according to claim 1, wherein the plurality of pixel circuits forms a hybrid unit pixel, wherein the first portion with respect to the hybrid unit pixel is twelve intensity photodiodes, wherein the second portion with respect to the hybrid unit pixel is four EVS photodiodes, and wherein each of the twelve intensity photodiodes has a gate that shares one of four floating diffusions.

7. The imaging sensor according to claim 1, wherein the plurality of pixel circuits forms a hybrid unit pixel, wherein the first portion with respect to the hybrid unit pixel is fourteen intensity photodiodes, wherein the second portion with respect to the hybrid unit pixel is four EVS photodiodes, and wherein each of the fourteen intensity photodiodes has a gate that shares one of four floating diffusions.

8. The imaging sensor according to claim 7, wherein the fourteen intensity photodiodes includes four intensity photodiodes with a blue light filter, six intensity photodiodes with a green light filter, and four intensity photodiodes with a red light filter.

9. A method comprising:

controlling, with control circuitry, a plurality of binning transistors according to a first mode; and controlling, with the control circuitry, the plurality of binning transistors to change from the first mode to a second mode, wherein, in the second mode, the plurality of binning transistors bins together a first portion of a plurality of pixel circuits in a pixel array and bins together a second portion of the plurality of pixel circuits, respectively, and wherein the first portion of the plurality of pixel circuits individually includes two or more intensity photodiodes and the second portion of the plurality of pixel circuits individually includes two or more vision sensor (EVS) photodiodes that are separate and distinct from the two or more intensity photodiodes.

10. The method according to claim 9, wherein the first mode is a non-binning mode, and wherein, in the non-binning mode, the plurality of binning transistors are in an OFF state.

11. The method according to claim 9, wherein the second mode is a first binning mode and the plurality of binning transistors includes a plurality of SNG transistors, and wherein, in the first binning mode, the control circuitry controls the plurality of SNG transistors to horizontally bin together sense nodes of the second portion on a row-by-row basis of the pixel array.

12. The method according to claim 9, wherein the second mode is a first binning mode and the plurality of binning transistors includes a plurality of VNG transistors, wherein, in the first binning mode, the control circuitry controls the plurality of VNG transistors to vertically bin together sense nodes of the second portion on a column-by-column basis of the pixel array.

13. The method according to claim 9, wherein the second mode is a first binning mode and the plurality of binning transistors includes a plurality of ALSEN transistors, and wherein, in the first binning mode, the control circuitry controls the plurality of AL SEN transistors to horizontally bin together floating diffusions of the first portion on a row-by-row basis of the pixel array.

14. The method according to claim 13, wherein the plurality of binning transistors includes a plurality of VNG transistors, wherein, in the first binning mode, the control circuitry controls the plurality of VNG transistors to vertically bin together the floating diffusions of the first portion on a column-by-column basis of the pixel array.

15. The method according to claim 9, wherein the first mode is a first binning mode and the second mode is a second binning mode, wherein the plurality of binning transistors includes a plurality of SNG transistors, and wherein, in the first binning mode, the control circuitry controls the plurality of SNG transistors to horizontally bin together sense nodes of the second portion on a row-by-row basis of the pixel array.

16. The method according to claim 15, wherein the plurality of binning transistors includes a plurality of VNG transistors, and wherein, in the first binning mode, the control circuitry controls the plurality of VNG transistors to vertically bin together the sense nodes of the second portion on a column-by-column basis of the pixel array.

17. The method according to claim 9, wherein the first mode is a first binning mode and the second mode is a second binning mode, wherein the plurality of binning transistors includes a plurality of ALSEN transistors, and wherein, in the first binning mode, the control circuitry controls the plurality of ALSEN transistors to horizontally bin together floating diffusions of the first portion on a row-by-row basis of the pixel array.

18. The method according to claim 17, wherein the plurality of binning transistors includes a plurality of VNG transistors, wherein, in the first binning mode, the control circuitry controls the plurality of VNG transistors to vertically bin together the floating diffusions of the first portion on a column-by-column basis of the pixel array.

19. An electronic device comprising:

a pixel array including a plurality of pixel circuits; and a plurality of binning transistors, wherein a first portion of the plurality of pixel circuits individually includes two or more intensity photodiodes and a second portion of the plurality of pixel circuits individually includes two or more event vision sensor (EVS) photodiodes that are separate and distinct from the two or more intensity photodiodes, and
wherein the plurality of binning transistors are configured to
bin together the first portion,
bin together the second portion, and
bin together the first portion and bin together the second portion, respectively.

20. The electronic device according to claim 19, wherein the plurality of binning transistors includes a plurality of SNG transistors that are configured to horizontally bin together sense nodes of the second portion on a row-by-row basis of the pixel array.

\* \* \* \* \*